(12) United States Patent
Heyring

(10) Patent No.: US 8,909,505 B2
(45) Date of Patent: Dec. 9, 2014

(54) USEABLE ELECTROMAGNETIC BLUEPRINT OF THE STRUCTURE OF SPACE

(75) Inventor: Christopher Brian Heyring, Eagle Bay (AU)

(73) Assignee: Hyperspace Pty Ltd, Eagle Bay (AU)

( * ) Notice: Subject to any disclaimer, the term of this patent is extended or adjusted under 35 U.S.C. 154(b) by 514 days.

(21) Appl. No.: 13/319,154

(22) PCT Filed: May 10, 2010

(86) PCT No.: PCT/AU2010/000536
§ 371 (c)(1),
(2), (4) Date: Dec. 5, 2011

(87) PCT Pub. No.: WO2010/127409
PCT Pub. Date: Nov. 11, 2010

(65) Prior Publication Data
US 2012/0141966 A1    Jun. 7, 2012

(30) Foreign Application Priority Data

May 8, 2009    (AU) ................................ 2009902059

(51) Int. Cl.
| | |
|---|---|
| *G06G 7/48* | (2006.01) |
| *G09B 23/18* | (2006.01) |
| *H02N 99/00* | (2006.01) |
| *G06T 17/00* | (2006.01) |
| *G06F 17/50* | (2006.01) |
| *G06F 17/10* | (2006.01) |

(52) U.S. Cl.
CPC ................ *H02N 99/00* (2013.01); *G06T 17/00* (2013.01); *G06F 17/5009* (2013.01); *G06F 17/10* (2013.01)
USPC .............................................. 703/6; 434/301

(58) Field of Classification Search
CPC . G06F 17/10; G06F 17/5009; G06F 17/5036; G06F 17/5018; H02N 99/00
USPC .............................................. 703/6; 434/301
See application file for complete search history.

(56) References Cited

U.S. PATENT DOCUMENTS

| | | | |
|---|---|---|---|
| 6,219,629 B1* | 4/2001 | Namiki ........................... | 703/13 |
| 6,507,795 B2* | 1/2003 | Namiki ........................... | 702/66 |
| 6,513,001 B1* | 1/2003 | Kapur et al. .................... | 703/13 |
| 6,879,942 B1* | 4/2005 | Nagase et al. ................... | 703/2 |
| 7,987,076 B2* | 7/2011 | Odajima ........................... | 703/5 |
| 8,459,119 B2* | 6/2013 | Miyamoto ...................... | 73/602 |
| 2003/0137511 A1* | 7/2003 | Aruga et al. .................. | 345/426 |

* cited by examiner

*Primary Examiner* — Aniss Chad
(74) *Attorney, Agent, or Firm* — Cascio & Zervas

(57) ABSTRACT

A useable electromagnetic blue print of the structure of space is disclosed. The blue print comprises an irregular tetrahedral arrangement comprising of four isosceles triangular faces each having two angles of approximately 54.73561 degrees and one of approximately 70.5 degrees, the four triangles being arranged in two pairs, the paired triangles being connected along the longer edges of each of the triangles, the included angle between the two faces of the paired triangles being 90 degrees, the long edges of the two pairs of triangles being of the approximate ratio of 100:86.6 relative to the four shorter edges, and the long edges being located perpendicularly with respect to each other on opposite sides of the tetrahedral arrangement. The tetrahedral arrangement provides a modular component which is close-packable with three other similar adjoining modular irregular tetrahedral arrangements defining a specifically dimensioned octahedral arrangement. The outermost points of each tetrahedral and octahedral arrangement define nodal points such as the positions of four elementary particles wherein the magnetic and the electrical fields within certain materials and circuits can be constructively organized to perform a number of specific functions.

26 Claims, 20 Drawing Sheets

(i)

(ii)

(i)

(ii)

(iii)

(iv)

(i)

(ii)

(iv)

(i)

(ii)

(i)

(iv)

(ii)

(iii)

(v)

(vi)

(vii)

(v)

(vi)

(vii)

(ii)

(iii)

(i)

(ii)

(iii)

(iv)

(v)

(vi)

(vii)

(viii)

(ix)

(x)

(i)

(ii)

(i)

(ii)

USEABLE ELECTROMAGNETIC BLUEPRINT OF THE STRUCTURE OF SPACE

FIELD OF THE INVENTION

The present invention relates to a useable electromagnetic blueprint of the structure of space.

BACKGROUND OF THE INVENTION

Prior art electromagnetic technology is defined in terms which use mathematical rules and laws such as Faraday's and Fleming's, Lenz's Right and Left Hand Rules and Laws, as well as Maxwell's equations. These rules and laws are applied to good effect in all electromagnetic devices to manipulate the functions of equipment such as electrical coils, generators, electrical motors, photovoltaic cells and even superconductors without any real detailed knowledge of why, exactly, electricity functions at a counter intuitive quantum level.

Collectively these right and left hand rules and laws indicate that electromagnetism has highly specific geometrical properties with regard to symmetry and asymmetry, especially in terms of applied motion and resistance to such motion, and the production of flux fields and electrical induction, generators etc. It is widely understood by physicists that matter, charge and electromagnetism are all manifestations of some sorts of structured activities within space and that geometry therefore underpins everything in physics. While there is a general acceptance that "Physics is Geometry" the understanding of tried and tested Euclidean geometry itself has become eroded to enable space to become warped and curved to explain gravity.

At this time physicists are very actively debating entanglement of pairs of particles such as electrons and photons which can only exist in pairs and are said to have 'up' or 'down' and 'left' and 'right spin states' and symmetries and it would appear that entangled particles are mysteriously interconnected over large distances. There is no real current knowledge as to what holds the half charge particles together in an entangled state with a quantum spin and how the four basic cohesive fundamental interactions of nature such as electromagnetism and gravity actually interact in a spatially defined context to provide gravitational and/or inertial mass. Currently science cannot provide any definitive descriptions of the geometrical activities of fundamental particles which results in matter being cohesively held together or how in turn these fundamental activities provide gravity at distance which holds the entire cosmos together and yet which at the same time causes the theoretical accelerating expansion of the cosmos. To this end it is calculated by cosmologists that 23% of all matter in the universe is dark, transparent and invisible and that there must be in the order of 72% hypothetical dark energy which is also undetectable directly. Since energy and matter are known to be functionally related it could be said that current scientific research indicates that at least 95% of everything in the entire cosmos is invisible and can only be inferred through mathematics.

Mathematical geometry can very satisfactorily define mechanical activities and force vectors within a real three dimensional space in the context of time, however in the late $18^{th}$ century the concept of one-directional time became related to space such that science now describes space in terms of being four dimensional space-time. Once space and time became rolled into one homogenous four dimensional entity the concept of true spatial dimensions and force vectors became blurred and space-time became the general term to describe the number of independent coordinates or variables needed to determine the state of any object. This erosion of the independent meanings of space and time provided mathematicians with the powerful tools of 'geometrical' analysis which permits multi dimensional analysis to be applied to almost anything from statistics to the state of the economy as well as the history and the intimate structure of the cosmos, however some of the extrapolations arising from defining space and time in terms of more than three spatial dimensions and one of time works well mathematically but leads to irrational and empirically incorrect solutions regarding the very basic forces of nature, space and time.

At present there is much debate in the scientific fraternity regarding 'String Theories' and 'Super-symmetry' theories, which require that there be between five and eleven or even more dimensions of space. Some current main-stream theories posit non-directional time, or that time itself does not exist or did not exist before the 'big bang'. These counter intuitive theories are non-rational and are unproven, and in their current form they fail to provide any testable theories or practical information or technical applications in the real world. However, it is thought by some in the scientific community that man-kind's inability to empirically understand multidimensional space-time is more of a human perception problem than an objective reality and that these theoretical notions of String Theory will lead to a satisfactory 'Grand Unified Theory' and the related 'Theory Of Everything'. It is expected that these theories should ultimately explain everything from the (theoretically) missing 95% of the universe's matter and dark energy to the birth and ongoing existence of the universe. A new level of understanding of physics, and the energetic structure and geometry of space should inevitably lead to many practical applications. Since even basic electromagnetism indicates that it functions within the basic rules described by a strong three dimensional geometrical relationship (such as the specifically polarised magnetic field aligned perfectly at right angles to a wire carrying a specific electrical current) it could be considered unrealistic to abandon a simple Euclidean geometry in favour of attempting to analyse electromagnetism in terms of a multidimensional space which inherently fails to distinguish between fact and fiction.

Mathematics describing multidimensional geometry is the main language which is used to define physics and cosmology but it is proving to be so flexible and ubiquitous that it can be used to support almost any abstract theory of spatial reality what-so-ever. Leading theories, such as String and Super-Symmetry Theories that employ a variable number of spatial vectors or dimensions to resolve the structure of space have come to be known as a 'Theory of Anything' rather the 'Theory of Everything". Before any theoretical information can be practically applied it is required to be scientifically testable and permit provable predictions to be made.

Even the two successful and core scientific disciplines, quantum mechanics and relativity still remain functionally incompatible and are still substantially unresolved although it is generally expected that current research will shed some light on the reality of space, time, energy and matter. To this end many billions of dollars have been and are currently being spent on building facilities like the 27.5 km diameter particle accelerator called the Large Hadron Collider (LHC) at CERN in Switzerland and the other various accelerators, cyclotrons and synchotrons in other locations. These are amongst the biggest and most expensive machines ever made by humankind and ironically they are used to research what makes the smallest things in nature work at the elementary particle level, with a view to understanding fundamental forces of nature (including electromagnetism), and it is to be hoped that this information will lead to improved technological spin-offs in the future.

It is known that both nuclear fission reactors and nuclear fusion reactors are capable of providing massive amounts of energy. Fusion reactors such as the large Tokomaks at Joint European Torus (JET) and the proposed Iter torus processes have not become technically and commercially viable as yet although billions of dollars have been spent on and are still committed to research funding in this quest over the past fifty years.

The nuclear fusion technologies like JET require that the fusion process takes place in a hot plasma which is electromagnetically contained within a toroidal chamber. The fusion process is intended to replicate the mechanism which powers the sun and at similar temperatures, and the by-product of the conversion of hydrogen to helium is the production of additional heat which is intended, for example, to run steam turbines which in turn run electrical generators to provide electricity in the same way as fission reactors turn heat into electrical power. In some respects the fission and fusion electrical power generation techniques can be considered to be archaic in that the processes are very indirect and like a coal powered generator system in which the fusion reactors only produce heat to run old fashioned steam turbines to drive electrical generators, they do not directly produce electrical power themselves as the result of any intrinsic electromagnetic mechanism as in photovoltaics.

In contrast to known fusion/fission processes the subject of this document describes the required electromagnetic geometry which can assist or can be used to make a template to define a range of low energy room temperature electromagnetic systems which can be applied to have various end uses which could assist or permit the direct harnessing and the conduction of electromagnetic energy less expensively at ambient temperatures than current fusion/fission and 'cold' superconducting technologies.

It is widely thought by the scientific community that even in a complete vacuum there is a significant amount of energy which is referred to in quantum mechanics as zero-point energy. Also, throughout space, background radiation has been detected that suggests that energy exists throughout the vacuum of space. At this time various government scientific organizations are searching for the theoretical but very illusive dark energy and dark matter that is believed by cosmologists to fill space. All these grand and expensive projects turn on the three or four fundamental forces of nature, of which electromagnetism is of paramount importance since approximately 90% of all matter and therefore energy involves electrons and photons which are amongst the prime movers at the core of space-time.

However, currently there is little agreement and understanding of the exact mechanics of how the fundamental forces in space-time actually work. Indeed, many leading physicists believe that even time and space did not exist before the 'big bang' (birth of the universe) and the establishment view is that even the laws and principles of physics probably only came into existence at that time. The theoretical size and age of the cosmos is predicated upon un-provable mathematical notions, 'constants' such as the 'fine structure constant' and other mathematical patch-ups and fix-ails which are artificially applied to make the mathematics work although the logic and rational behind the constants may not be understood. Constants such as the fine structure constant, or alpha, and lambda underpin theories which are used to explain the rapid 'expansion' of the cosmos which is thought to have been driven by some illusive energetic forces which can be traced back to a singularity some 13.7 billion years ago. In effect this means that all the energy and matter in the entire cosmos mysteriously exploded into existence out of nowhere at one point in time (when time itself did not exist) at some unspecified location, coming from nowhere and progressively carving out new space-time, and only since that time have the current laws of thermodynamics and physics applied. Obviously these ideas are generally counter intuitive and appear quite irrational to the general public and indeed many eminent scientists themselves are now beginning to think that cosmology and physics itself is in such a state of irresolvable confusion that the fundamental laws of physics themselves may need to be scrapped or at least be substantially redefined.

Some redefinition and reinterpretation of the theories and laws can incorporate some new concepts and principles which provide better ways to resolve the significant problems in modern physics concerning issues such as dark energy and the cosmological constant and this understanding in turn will facilitate the better manipulation of the fundamental forces in nature to assist the design of some entirely new technologies. The laws and rules of thermodynamics and entropy ultimately dictate that all matter and gradient systems will tend to dissipate or 'run down' into an equilibrium or chaotic ground-state. While this is undoubtedly correct in most everyday circumstances it would appear that in the context of electromagnetism the laws and rules may need some reinterpretation as its geometry and topology requires the elements to continuously keep 'running downhill' along the paths of least resistance towards a continuously perturbed but orderly ground-state without apparently creating the destructive and chaotic disorder normally associated with entropy.

For example, the laws relating to the conservation of energy dictate that energy cannot be created or destroyed. However, even when simple bar magnets are attracting or repelling one another they could be considered in some contexts to be doing some dynamic 'work' which is indistinguishable from and exactly equivalent to the work done by electromagnets which are powered by an external energy source. The fact remains that a bar magnetic or even a planetary magnetosphere does comprise of related electromagnetic elements geometrically arranged in three dimensions and in the context of time such that the elements do persistently 'run downhill' along the paths of least resistance in a non commutative sequence such that activity in each dimensional plane appears to be running downhill with respect to itself but in doing so appears to be being conveyed uphill with respect to the other elements in an adjacently perpendicular plane, and so forth. For these reasons the magnetosphere of our own planet has provided at least some of the power required to cause the turbulence in the magma whose friction has been radiating heat outwards faster than the sun's heat being gained inwards, and this has been happening billions of years. This is evidenced by the fact that the earth's crust is there simply because of the heat loss at the surface which causes it to 'freeze' or solidify as heat is lost from the outer layer into the extreme cold of outer space. Current understanding of physics can only therefore provide a description of electromagnetism which should be considered to be a convenient over simplification which obscures the dynamic geometric reality of electromagnetism.

While entropy is traditionally defined in terms of the dissipation of heat from hot to cold and the propagation of chaotic microscopic disorder it can be shown that there is also the natural progression of energy and matter towards a dynamic electromagnetic ground-state which initiates the very orderliness of structure within the cosmos. This is evidenced for example, by the anisotropic background radiation of space and even the self organisation of electromagnetic elements and materials leading to the aggregation of matter to form planets and stars, many of which exhibit magnetospheres that reflects the inherent geometry of electromagnetism which in turn actively promotes the spontaneous polarisation and the orderly arrangement of structure at many levels throughout the cosmos.

This patent application seeks to demonstrate that certain novel technologies can be designed when the functional geometry of electromagnetism is conceptually redefined in very simple and provable terms. This patent application further seeks to clarify the reasons behind electromagnetism's inherent geometry such as the known right and left hand rules and laws, mirror image symmetry and non-commutative spin handedness and identifies some of the inner workings of electromagnetism such that this information can be applied usefully to draw a better conceptual 'blue-print' or 'roadmap' of the mechanics of electromagnetism so that novel technologies can be designed around these improved guide lines.

This background information is of importance to the explanation of this patent which seeks to define the geometry of any physically permissible activity including electromagnetism within a three dimensional space and in the context of time (space-time), such that this information can be usefully applied to technology. To this end this patent application provides a simple but solid 'bricks and mortar' approach to defining the fundamental forces of nature and thereby providing an improved 'blue-print' for technology to build upon.

This document therefore starts with a straightforward interpretation of the permissible mechanics involved in the geometry and topology of electromagnetism at an everyday macro scale and it also recognises that these same basic rules of spatial definition can also be reinterpreted and applied to electromagnetic activity at a nano and quantum level in as much as there is a high degree of reciprocity between the electrical and magnetic facets of electromagnetism which can, for example, be applied to common electrical technologies and even the invisible geometry of three dimensional propagation of electromagnetic waves such as radio waves.

For example, a moving charge has an electric field and an magnetic field, and in general, the electric and magnetic fields are not completely separate phenomena; what one observer perceives as an electric field, another observer in a different frame of reference perceives as a mixture of electric and magnetic fields often known as electromagnetic fields. In quantum mechanics, disturbances and the transmission of quantized energy in the electromagnetic fields is by way of photons. In crystal lattice structures the electromagnetic wave excitations are called phonons. The spatial definition and mechanics of particle relationships in crystallography is one of the tenets of this document.

A photon is an elementary particle with an electric charge and it may be described as a subatomic particle or an ion and it is of central importance to the workings of electromagnetic waves. Therefore it can be interpreted as the common feature in the so called wave-particle duality, ie. under the appropriate conditions, electrons and other matter would show properties of either particles or waves.

A collection of charged particles, or even a gas containing a proportion of charged particles, is called a plasma and is the most common state of matter in the universe. Particles may have a positive, negative or no charge.

The space surrounding an electric charge or in the presence of a time-varying magnetic field has a property called an electric field which may exert a force on other electrically charged objects.

In a vacuum, a beam of ions or electrons may be formed. In other conductive materials, the electric current is due to the flow of both positively and negatively charged particles at the same time. In still other situations, the current is entirely due to positive charge flow. Electric currents in sparks or plasma are flows of electrons as well as positive and negative ions. In crystallography, ice and in certain solid electrolytes, the electric current may be composed of flowing ions.

The electron is a subatomic particle that carries a negative electric charge. It has no known substructure and is believed to be a point particle. Electrons participate in gravitational, electromagnetic and weak interactions. This document seeks to usefully re-interpret the behavior of elementary particles and issues such as the intrinsic angular momentum, or spin, of an electron and the electron's antiparticle, the positron, which together are thought to mutually annihilate such that an electron-positron pair can produce gamma ray photons with significant energy.

This document will demonstrate why there is no experimental evidence for any of the elementary particles having spatial extent, therefore being zero-dimensional and not taking up space. Elementary particles are usually considered to be point particles or point-like particles, which are idealized objects used in physics.

SUMMARY OF THE INVENTION

In accordance with a first aspect of the present invention, there is provided an electromagnetic blueprint of the structure of space, comprising a four sided volume externally bounded by four hyperbolic paraboloid surfaces defined by the eight shorter edges of four close-packed tetrahedral units being equivalent to a specifically dimensioned octahedron in the outermost points of the main central axis is the same length as the distance between the four outer adjacent points or corners in a perpendicular plane to the main central axis, the four curved faced hyperbolic paraboloids together defining a first hyperhedron being a modular volume unit such that four additional similar second hyperhedral units may be close-packed and thereby totally surrounding the first hyperhedral unit such that the main axis of the first hyperhedral unit is perpendicular to each of the main axes of the four second hyperhedral units, similarly further additional hyperhedral units can be consistently close-packed and added indefinitely in each of the three planes of three dimensional space to thereby define a three dimensional lattice of close-packed hyperhedral units, each being rotated perpendicularly relative to the adjacent and contiguous hyperhedrons such that a line following the hyperbolic paraboloid curved surface between any of the diagonally opposite corners in both perpendicular directions will each describe one half of a parabolic wave form, such that when the three dimensional lattice is defined in accordance with the above, the other half of a parabolic wave or one fully substantially sinusoidal or parabolic wave oscillation is completed by the extension of the diagonal lines across the curved surfaces of adjacent hyper-parabolic interface surfaces of the adjacent hyperhedral units, and the lattice being modular is extendable such that the wave forms may continue to propagate efficiently across the diagonal axes of all the consecutive and connecting hyperbolic paraboloids and along all the saddle shaped curved surfaces in all three spatial dimensions, the arrangement thereby describing a three dimensional wave structure which can be used as a blueprint in technology with which to design and manipulate electromagnetic materials and to assist with the design of materials with specific solid state electromagnetic and crystallographic qualities and properties.

In accordance with a second aspect of the present invention, there is provided an electromagnetic blueprint of the structure of space comprising a central point defined and spatially located at the central nodal position between three mutually perpendicular intersecting planes such that pairs of opposite value and parallel vectors are located immediately on either side of the central point in each of the three perpendicular planes, such that the first parallel pair of opposite value vectors intersects the second pair of opposite value parallel vectors which in turn intersects the third pair of opposite value vectors which in turn intersects the first pair, such that a specific cyclical non commutative order is established by each of the two groups of three vectors of the same value, the cyclical order of each group of three vectors thereby define opposite rotational spin directions around the central point such that a central axis is establish through both the two groups of three vectors of one value on either side and through the central point, the central axis may represent the axis of polarisation through the group of three pairs of opposite value vectors and the pairs of opposite vectors may represent pathway means of electrical conductive or magnetically permeable means, the arrangement thereby describing an electromagnetic entity defined by a central point having central axis passing there through the central point and a perpendicular field with respect to and surrounding the main central axis, and surrounding the main central axis on opposite sides of the central point two opposite spin symmetries are defined such that the pathway means may extend beyond the immediate vicinity of the central point in order to complete a number of different electromagnetic circuit arrangements which may be used to define electrical and magnetic fields and circuits which may be constructively arranged to perform a variety of specific electromagnetic functions including the transmission of electromagnetic waves of definable wavelengths and frequencies and the arrangement also provides a means to design and manipulate materials in crystallography and to assist with the design of materials with specific solid state electromagnetic qualities and properties.

In accordance with a third aspect of the present invention, there is provided two associated electromagnetic cube matrix structures which when moved or become accelerated relative to one another by way of an input of external force, thereby cause forces of tension and compression to develop there between and along the diagonal means linking between the two associated two sets of cube matrix structures, the collective arrangement may thereby internally propagate three dimensional wave structures within the arrangement such that the wave structures may further develop into variable and resonant frequencies within the two sets of related cube structures defining an electrical potential gradient between the two cube matrix structures in association with the diagonal linking means, such that an externally applied input such as a force of acceleration applied to one set of the two cubes matrix structures may cause the repetitive extension and contraction of the tension and compression means which act as conducting means across the electrical gradient, the relative motions of the collective arrangement which may thereby initiate and cause conduction of a flow of electrical energy through the conductive pathway means being means associated with the two sets of cube structures and the diagonal connecting means, such that electrical energy becomes usefully harvestable during the application of any externally applied forces of acceleration or the relative movement of the two cube matrix structures and the diagonal linking means and the collective arrangement of tension and compression means may thereby be connected for usage or an appropriate energy storage or retrieval means, the arrangement thereby describing an electromagnetic entity which may produce electrical energy in response to the application of external forces such as acceleration.

BRIEF DESCRIPTION OF THE DRAWINGS

The present invention will now be described, by way of example only, with reference to the accompanying drawings, in which:

FIGS. 1(*iii*), (*iv*) and (*v*) are perspective representations of the magnetic fields surrounding two perpendicular conductors as seen from three different views.

FIGS. 1 (*vi*) and (*vii*) are diagrammatic representations of the magnetic fields surrounding a single conductor.

FIG. 4(*ii*) is a side elevation view of FIG. 4(*i*) representing the conductor in the shape of a knot but as viewed from one side.

FIG. 5(*iv*) is a perspective view representing two sets of conductors and the surrounding magnetic fields linked by two of the shared conductors.

FIG. 7(*ii*) is a side elevation showing a similar arrangement as FIG. 7(*i*) but in which the conductors have been linked to describe parts of three discrete circuits.

FIG. 7(*iii*) is a two dimensional diagrammatic representation of the connectivity of conductors and mapping the electrical circuits surrounding a toroidal form.

FIG. 7(*iv*) is a perspective representation representing alternative connection of perpendicularly arranged conductors.

FIG. 9(*iv*) is a perspective representation of magnetic fields surrounding three spatially merged toroidal forms.

FIGS. 9(*vi*) and (*vii*) are perspective representations of views inside the toroidal forms which are represented externally in FIG. 9 such that 9(*vii*) is equivalent to FIG. 9(*v*).

FIG. 10(*ii*) is a perspective view along through the middle of a conductor such as one of those represented in FIG. 10(*i*).

FIG. 10(*iii*) is a perspective representation of one modular part known as a hyperhedron fitting together with other similar modular hyperhedrons to form a single conductor.

FIG. 10(*iv*) is another perspective representation of a single hyperhedron.

FIG. 10(*v*), (*vi*) and (*vii*) are perspective views of similar hyperhedrons illustrating different views and the symmetry of hyperhedrons.

FIG. 11(*ii*) is a perspective view representing three perpendicular conductors as in FIGS. 10(*i*) and (*iii*) and equivalent to FIG. 2(*ii*).

FIG. 11(*iii*) is a perspective view of six conductors arranged in two sets equivalent to FIG. 5(*ii*) but showing symmetry differences as shown in FIGS. 11(*i*) and (*ii*).

FIG. 12(*v*) is perspective representation of one tetrahedron such as represented in FIGS. 12(*i*) to 12(*iv*).

FIG. 12(*vi*) is a perspective representation of a tetrahedron with corner spheres indicating the positions of particles.

FIG. 12(*vii*) is a perspective representation of an octahedron showing the position of particles at each point.

FIG. 12(*viii*) is a similar perspective representation to FIG. 12(*vii*) but shows a hyperhedron bounded by spherical particles.

FIGS. 12(*ix*) and (*x*) are perspective representations illustrating two hyperhedra and two octahedra combined respectively.

FIG. 13(*ii*) is a perspective view illustrating three perpendicularly meshed double helix members.

FIG. 14(*ii*) is another perspective representation as in FIG. 14(*i*) but showing three hyperhedra arranged in a row and including the same corner particles.

FIG. 14(*iii*) represents two orthogonal or cube grids which comprise of the 'a' and 'b' axes of adjacent hyperhedra.

FIG. 14(*iv*) is a perspective drawing showing rows of meshed hyperhedra arranged perpendicularly and partially contained within a frame lattice indicating the position of corner particles within two discrete sets of cubes, one set being displaced vertically and horizontally by one half of the cubes lengths. FIG. 14(*iv*) additionally indicates the trajectory of perpendicular electromagnetic waves passing along and around the hyperhedral structures.

FIG. 15(*ii*) is a two dimensional diagrammatic view through a series of adjacently arranged clear hyperhedra showing the possible refraction of light or photon patterns through the rows of hyperhedra.

DESCRIPTION OF AN EMBODIMENT OF THE INVENTION

To explain the useable workings of electromagnetism it is necessary to go back to basics and take into account the geometry that any electromagnetic forces can adopt in a simple Euclidean three dimensional space in the context of time. As far as possible this will be represented in the Figures.

Many of the arrangements shown depict Right/Left handedness (R & L) and this is included in the numbering system of the drawings for clarity.

Most drawings represent three dimensional perspective arrangements and when one set of conductors is depicted as being stacked one on top of another the R/L handedness of the uppermost conductors is given first.

The orientation of the electrical conductors or fields is conveniently defined in some perspective drawings such that '+>−' denotes that the positive + terminal is uppermost above the plane of the paper and negative symbol − is located under the plane of the paper, and therefore '−>+' conversely indicates that the negative terminal is uppermost and the positive terminal is located below the plane of the paper.

It is noted that electrical current is sometimes conventionally represented in text books to be travelling in the opposite direction to the negatively charged electrons which are often considered to carry the current and indeed there is reason in some circumstances to define the different components of electrical current as though they travel in opposite directions. The preferred language and names used in this document to describe the polarity orientation of the magnetic flux and the electrical current may vary from some other known terminologies but the underlying working principles of the differing aspects of electromagnetism should be understood by those skilled in these subjects and the meaning behind the language used should be able to be readily understood. Accordingly the polarity of the magnetic flux path is indicated in all the drawings with arrows such that North (the flux seeking the South polar end) is marked with a 'solid' arrowhead while South (the flux seeking North pole) is indicated with a 'hollow' arrow head.

It is well known that when a single electrical conductor carries a current in a specific direction it exhibits a perpendicular flux field around the conductor of a specific polarity relating to the direction of the current flow. When the current direction is reversed so is the polarity of the flux.

Figure 1:
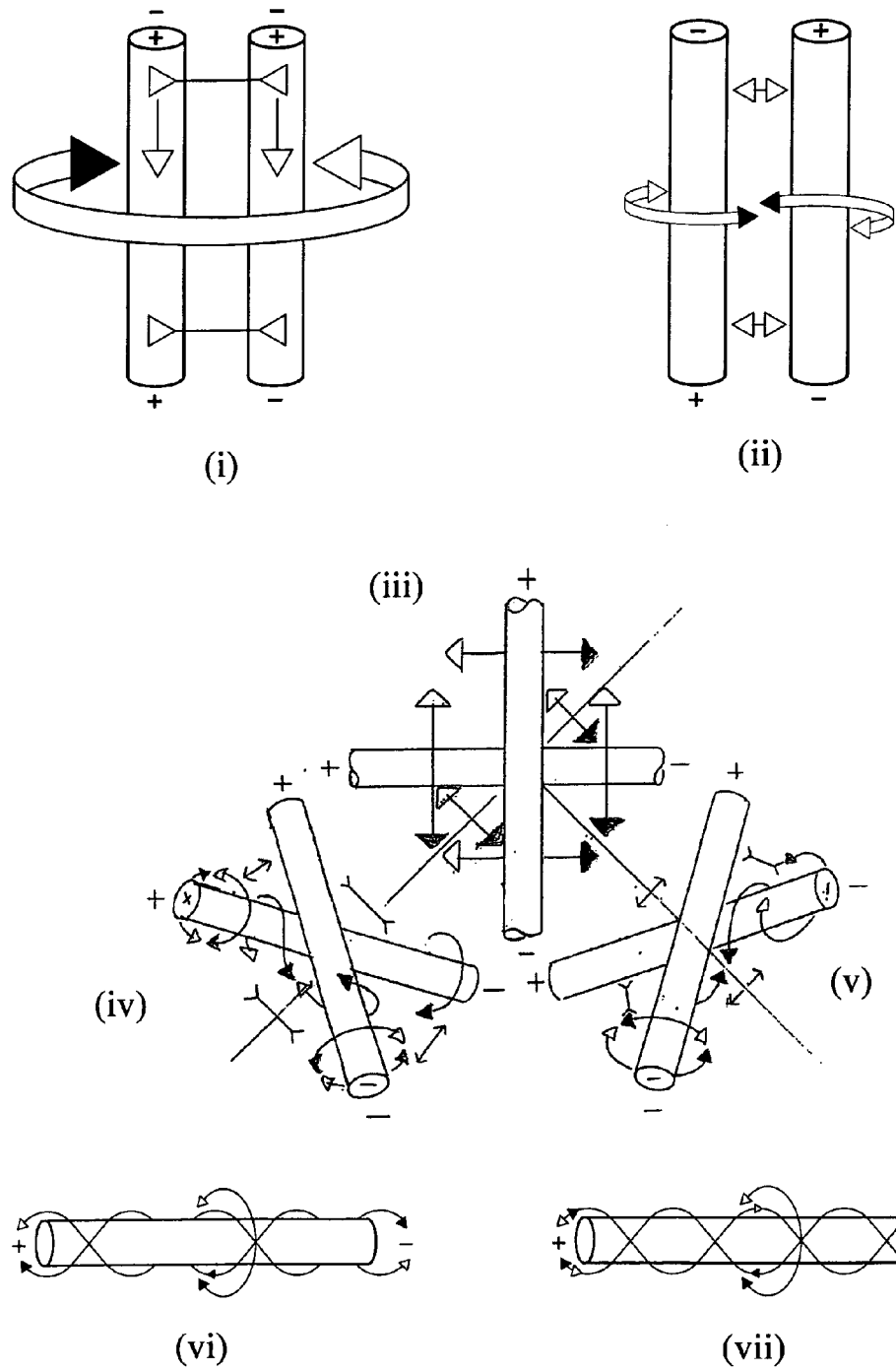
FIGS. 1(*i*) and (*ii*) are diagrammatic perspective representations of the magnetic fields surrounding two parallel conductors.

When two electrical conductors carrying a current are located parallel to each other such that the current is flowing in the same directions, as shown in FIG. 1(*i*) (+>−) the conductors' flux fields join together to form a single united flux sheath around the two conductors and since the flux is apparently in tension in the perpendicular North/South plane the sheath tends to tighten around the combined girth of the two conductors thereby drawing them closer together.

Conversely when parallel located conductors are provided with an electrical current in opposite directions (as shown in FIG. 1(*ii*)) their two flux sheaths cannot merge and tighten because the North seeking flux of one conductor is located adjacently and in an opposing direction to the North seeking flux of the other conductor and likewise the two South pole flux directions face each other, and since like poles repel the conductors tend to push apart as though there is a force of compression between the two.

When two conductors carrying current are located at right angles (as shown in plan view FIG. 1.(*iii*)) with respect to one another, the conductors do not achieve an entirely stable perpendicular balance but attempt to adopt the parallel orientation described above with the current travelling in the same direction as depicted in FIG. 1(*i*). The reason for this is that the flux in the included angle immediately adjacent to and between conductors in one diagonally opposite plane becomes more persuasively arranged North facing South (or N/S) and equally S/N (South facing North).

FIG. 1.(*iv*) and FIG. 1.(*v*) represent perspective views as seen from the diagonal axes as indicated. Therefore the two adjacent perpendicular conductors attract one another in one diagonal axis while the flux in the opposite diagonal plane between the conductors is consequently arranged N/N and S/S which therefore repels the conductors in this plane. The forces of tension and compression in opposite diagonal axes therefore reinforce each other to cause the electromagnetic elements to attempt to swing around and 'close-pack' into a parallel orientation thereby occupying the minimum space.

As a general rule electromagnetic entities normally attempt to 'run downhill along the paths of least resistance' in tension to reach an equilibrium ground-state by 'close-packing' into the minimum space (which may therefore appear to be compressed by an external force although it is more correctly bound by internal forces of tension). The arrangement shown in FIG. 1.(*iv*)(+>−), and FIG. 1.(*v*) (−>+) attempts to cause both conductors to adopt a parallel location, but while they are restrained in a perpendicular arrangement the current and flux directions are caused to assume a special working affinity with the current and flux orientation of the neighbouring conductor with which it is aligned.

Figure 2:
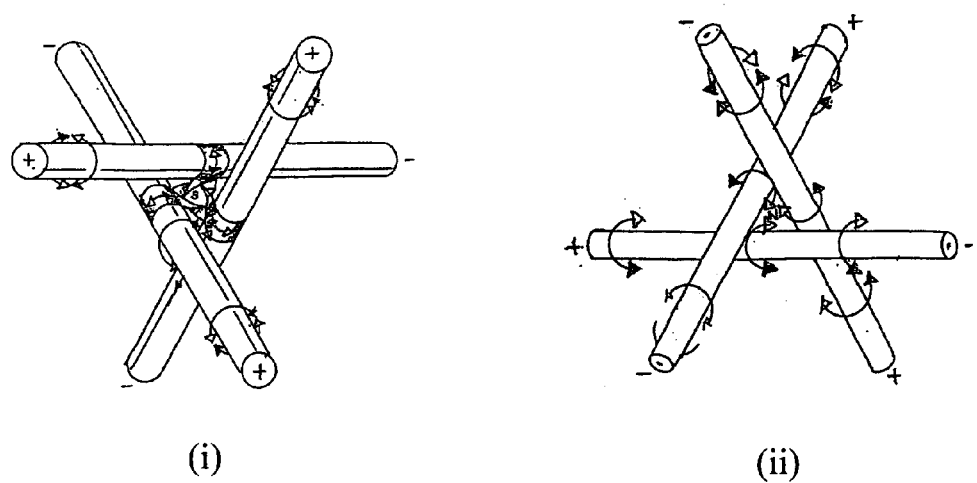
FIGS. 2(*i*), (*ii*) and 3(*i*), (*ii*) are perspective representations of the magnetic fields surrounding two different sets of three conductors as seen from different and opposite sides.

FIG. 2(*i*)(R, +>−) is a perspective plan view which shows three electromagnetic member components such as conductors (or any other electromagnetic means such as components of waves) passing by each other in a mutually perpendicular configuration, whereby the components may be defined as travelling downwards through the plane of the page, positive to negative ('+>−') in what may be called say, a clockwise or right handed spin (R) spiral direction. If the three right angle components are electrical conductors carrying a current the common axis through the centre could represent a magnetic South pole flux facing up out of the page—seeking a North polar end. The ribbon-like part of the drawing represents a typical magnetic flux path and which tends to spiral in a small vortex through the central polarised gap. It will be seen that there is some flux inter-change between the three conductors following the ribbon like form in the shape of a trefoil or toroidal knot. The significance of this will be described later on in this document. The three perpendicular members have a functionally non-commutative arrangement and the significance of this will also become more evident in this document.

FIG. 2.(*ii*)(R, −>+) is another perspective plan view but this represents the same three components as seen from the other side, or as though the structure has been turned over. It will be noted that the current is now reversed or 'travelling upwards' (from positive below to negative above, but the configuration of the three right angle conductors still remains clockwise or following a right handed (R) spin or spiral downwards as depicted in FIG. 2(*i*), however the polarity of the flux in the central common axis has changed and is now a North pole facing upwards (and therefore seeking a South polar end).

Figure 3:
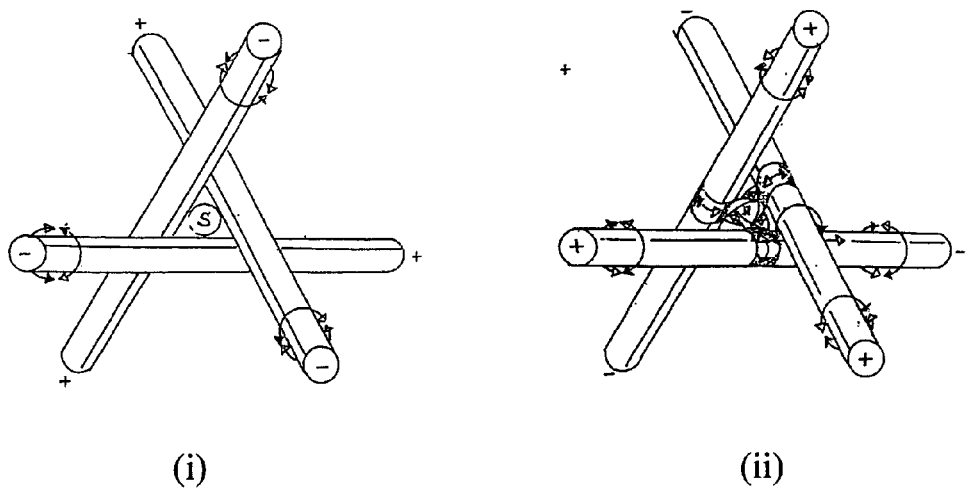

FIG. 3.(*i*) (L, −>+), represents the opposite (non-commutative) spin direction of components being left handed (L) or anti-clockwise, however because the spin direction has changed—left the South pole now faces upwards in the central polarised common axis.

FIG. 3.(*ii*) (L, +>−) represents the same structure turned over, such that the spin axis remains the same as FIG. 3.(*i*), but the current may now be defined as travelling downwards (positive to negative) and exhibiting a North (South seeking) pole facing upwards in the central common axis. The ribbon like part in the centre of FIG. 3(*ii*) represents the flux exchange path at the central part of the node and again indicates some flux interchange in a non commutative sequence.

The significance of this flux path in the shape of a trefoil or toroidal knot will become more significant with reference to subsequent figures.

A consequence of the arrangements shown in FIGS. 2 and 3 is that a common axis of specific polarity is immediately defined in between the three conductors depending on the right or left spin symmetry and the direction of the current flow. This polarised perpendicular junction of three members may, for the purpose of nomenclature used within this document, be called an electromagnetic node. Since these nodes may comprise of conductors which occupy some physical space and have some cylindrical thickness they become slightly spaced away from the centre point at the common axis and they would therefore appear to be 'stepping down', or 'stepping up' in a cyclical non-commutative sequence around the polarised common axis such that they can be described as having a rotational or clockwise (R)/anti-clockwise (L) stepped spin or spiral direction. Defining the 'right' or clockwise or 'left handed spin symmetry' or anticlockwise is no trivial coincidence when this is compared to the so-called left/right spins and 'up' and 'down' terminology used to describe elementary particles' behaviour in physics.

Bearing in mind the specific relationship of the flux polarity with reference to the direction of current flow along the conductors it will be seen that the flux surrounding each conductor is urged to align differently with the conductor on the 'stepped down' side to the other conductor on the 'stepped up' side so that each conductor shares a different flux status with the neighbouring perpendicular members, and, in a non-commutative sequence, (ref; FIGS. 2 and 3). In these Figures a line is drawn along the length of the face of each conductor which is in contact with the next to illustrate the non commutative step-down (or step-up) 90 degree twist which occurs between each of the conductors in a cyclical order. It is this which provides the genesis of the important parity transformations which will continue to be described in more detail in this document.

It will be understood from the above examples, (that the location of the electromagnetic elements in specific and different non commutative orders relative to each other), cause the magnetic flux to become functionally split into different and specific Right and Left spiral or helical electromagnetic component parts which are positioned substantially at right angles to each other within the flux sheath. So with reference to FIG. 1(*vi*) a single conductor is represented in which the average direction of the magnetic flux is conventionally perceived as being perpendicular to the conductor, while in fact, the flux may be functionally comprised of twin spiral components (say anti-clockwise) which are North seeking and a second South seeking twin pair of components contra-rotating (say clockwise) located at 90 degrees (rather than at 180 degrees) relatively.

It is notable that both pairs of spirals still maintain their correct average relationship with the direction of current flow in the conductor. There would appear to be two main reasons why magnetic flux is only conventionally represented as being at right angles to a conductor, firstly; the flux surrounding an isolated conductor (which is not being influenced by adjacent magnetic fields of other conductors) would automatically assume an average flux polarity positioning perpendicular to the conductor as there is no reason for it to deviate from this perceived minimum or average perpendicular energy position, (such as being influenced by adjacent conductors) and secondly, even when conductors are arranged closely such that the flux fields interact (as in FIGS. 2,3,4) then the two perpendicular spirals are not measurable because up until now there has been no magnetic parity sensing apparatus known and therefore available with which to detect the complex symmetry and helicity of the component parts of a magnetic flux which may appear in some contexts to violate spatial parity. It is significant to this patent application that while it is known that parity is important in quantum mechanics and that some processes involving the weak interaction violate the conservation of parity, there has been no known practical way of manipulating the charge-parity-time-symmetry features usefully and applying these features to useful devices.

While FIG. 1(vi) represents an electrical conductor comprising of two contra-rotating helices FIG. 1(vii) represents a conductor means surrounded by a flux pattern illustrated by a double contra-rotating helix structure.

Each helix is perpendicularly arranged relative to the other helix on the same and opposite sides and the arrangement can therefore maintain itself in a reasonable stable electromagnetic equilibrium. Since all matter, including all forms of life, are basically composed of electromagnetic structures it is self-evident why the most basic code of life, deoxyribonucleic acid or DNA, self-arranges into a stable double helix arrangement which represents the best fit interim groundstate within any suitable ambient environment. The DNA double helix code is based on carbon atoms and is said to comprise of two strands which may run in opposite spiral directions and it can be inferred from this that this arrangement therefore satisfies basic electromagnetic requirement known laws of electromagnetism.

The junction of three perpendicular electromagnetic entities or conductors as drawn in FIGS. 2 and 3, depict various symmetries of a node as if in isolation, whereas in reality within any three dimensional space or material there may be millions of different nodal relationships and interactions taking place within a complex lattice, but the underlying ground rules (relating to right/left/perpendicular, non commutative parity transformations) describing how these entities interrelate should be considered as remaining consistent.

Also this patent application should be read as embracing the idea that the conductors may not necessarily be 'conductors or wires' as such, but may be electrically conductive and magnetically permeable pathways through various lattices or chemically based materials similar to those used in photovoltaic composites, crystallography and diodes, for example.

As the laws of physics should be consistent at any scale it is useful to initially consider the situation when a junction 'node' of three conductors may be located in theoretical isolation and is caused to resolve its inherent internal and external forces within its own sphere of influence.

Each node, such as those shown in FIGS. 2 and 3, is required to resolve its electromagnetic internal and external forces as economically as possible to obey the laws of thermodynamics so that the North pole end only seeks a South pole and visa versa without a net gain or loss of energy. Also the parts described as 'conductors' must all ultimately be connected methodically to other parts to complete one (or more) electrically viable circuits and to achieve this economically from the required energy standpoint. Notionally this may be accomplished quite satisfactorily by any single R or L node in local isolation, when each of the three members are twisted around to join up with the next member.

Figure 4:
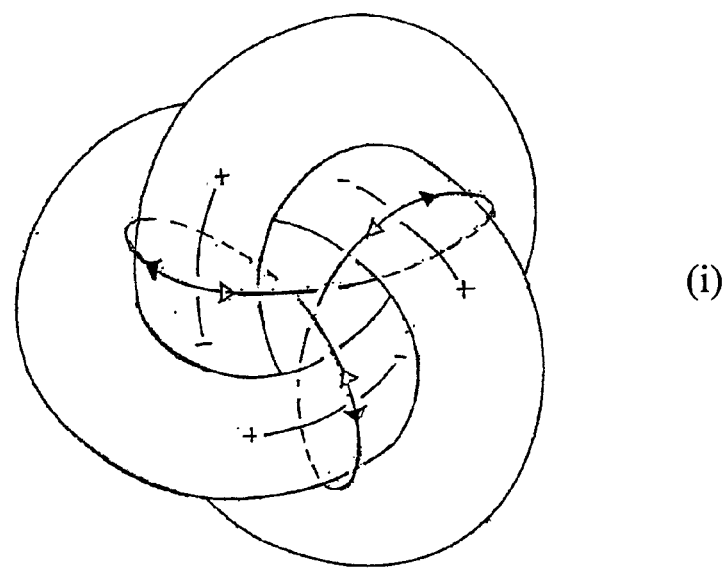
FIG. 4(*i*) is a plan view representing the magnetic circuit extending around a conductor in the shape of a knot.
Figure 4:
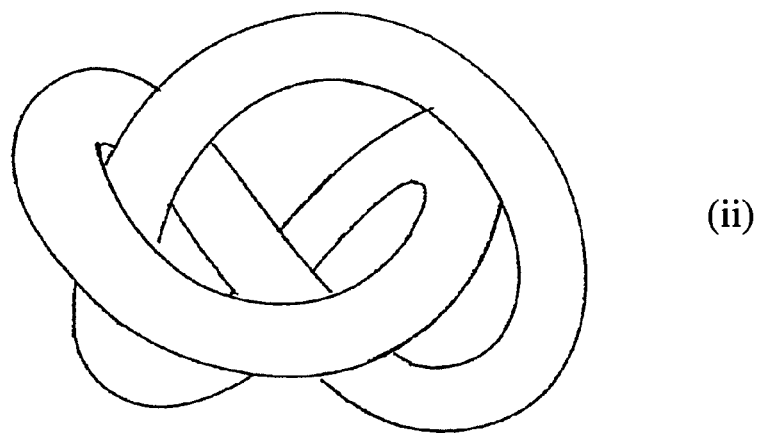

The substantially perpendicular magnetic circuit around the electrical components should also be continuous as shown in plan perspective view FIG. 4(i). FIG. 4(ii) is a side elevation view of a circuit similar to FIG. 4(i). It is notable that while the conductors trace out (say) a left handed node arrangement (cf. FIG. 3) in the form of a knot, the magnetic flux path follows the opposite directional path being a right handed path (cf. FIG. 2), also in the shape of a knot and these two knots interpenetrate each other and cross over in the central vortex area and as such the whole arrangement may be described as being double knotted such that the magnetic knot portion has to interpenetrate itself and therefore become chopped into segments or 'quantised' or 'blended' through the central zone. This significantly provides some information with regard to the basic and elementary cohesive forces of nature.

FIG. 4(i) (L,+>−) therefore shows that the electro- and magnetic circuits have been completed by joining the conductors end to end to form one continuous conductive member which keeps the correct flux field orientation consistent through-out the gyrations of the knot sometimes known as a trefoil knot. Significantly, in topology and knot theory the trefoil knot as illustrated in FIG. 4. is additionally known as a torus or hyperbolic knot and as such these most basic kinds of structures can be seen to provide the natural order and apparent force requirements which locks any form of electromagnetic elements together cohesively. FIG. 4. then represent the flux field path around the conductor's circuit which follows a Left toroidal or trefoil knot path inextricably intertwined and double locked around the conductor's Right handed toroidal—trefoil knot path and therefore significantly describing an intermeshed reverse symmetry. Since the electro-magnetic components themselves are substantially inextricably interrelated perpendicularly (cf. Maxwell) it is not difficult to understand how they are facets of the same entity and one of the most basic binding forces of nature.

The single knot or electromagnetic node as depicted in FIG. 4. may be considered to represent a potentially unstable structure without any well resolved parity and conceptually not unlike a theoretical monopole structure, which may not survive in reality when in isolation. However, in normal circumstances many nodal arrangements may occur in close proximity and are able to interact in clusters with others in the vicinity and they would naturally preferentially orientate themselves and each other to adopt a 'best-fit' compromise position requiring the 'least effort' leading to sharing and maintaining a common polarised axis, in tension. Collectively the electromagnetic elements and hence the nodes join up and close-pack on either side as part of a single but more complex toroidal knot. The structure of this will be described in stages below.

Figure 5:
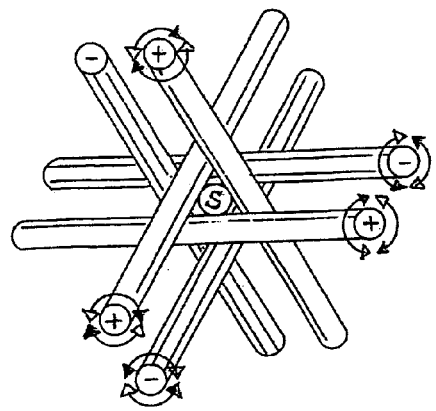
FIGS. 5(*i*), (*ii*), (*iii*) are perspective views of the magnetic fields surrounding six conductors stacked in perpendicular interpenetrating pairs.
Figure 5:
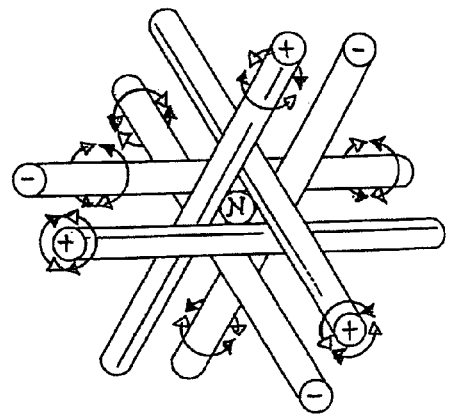
Figure 5:
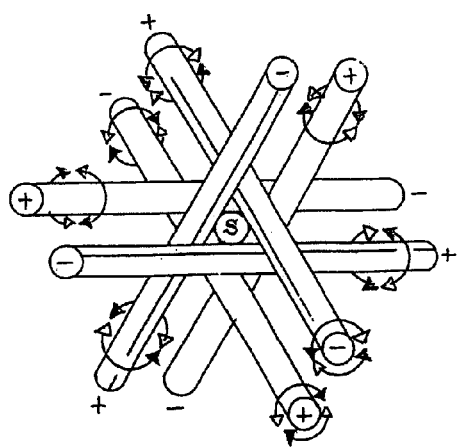
Figure 5:
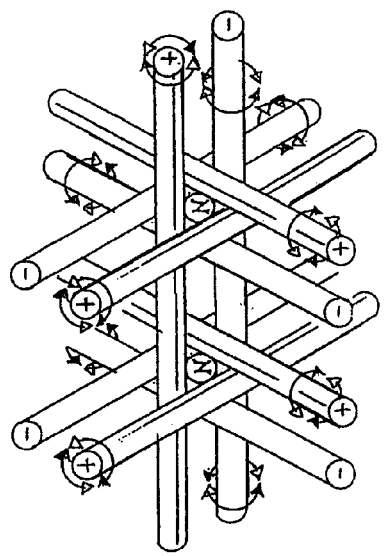

FIG. 5(i)R, +>−, L, −>+. and FIG. 5(ii) L, −>+, R, +>−, represent the same simple stack of two opposite spin symmetry nodes but as would be viewed from opposite sides. The uppermost node of three clockwise spin conductors depicted in FIG. 5(i) is equivalent to the node shown in FIG. 2(i)R stacked on top of three anti-clockwise conductors as represented in FIG. 3(i)L. In FIG. 5 the opposite spin symmetries are therefore shown as being nested or close-packed in the minimum space and at a minimum energy level available. In FIG. 5(i) the central common axis is marked 'S' to represent a South pole end as the flux 'coming upwards' in this vicinity would be North seeking and in FIG. 5(ii) the central axis polarity is marked North (South seeking).

For the purpose of defining the nomenclature, a pair of nodes close-packed together as shown in FIGS. 5(i) and 5(ii) will henceforth be called a 'domain' in this document for reasons stated below.

The central common polarised axis marked South in FIG. 5(i) and North in FIG. 5(ii) will be seen to be consistent in direction.

To demonstrate the relevance of the spin symmetry with reference to electrical flow direction FIG. 5(iii) L−>+, R+>− represents a domain of same R/L spin symmetries as FIGS.

5(*i*) and (*ii*) but in FIG. 5(*iii*) L. –>+, R+–, the current flow direction has been reversed with the consequence that there is now a defined South pole in the central axis instead a North pole. This is stated to emphasise that the spin symmetry and current directions can be mixed and matched to either create a continuous and homogenous N-S polarity or an alternating N-S-N-S-N polarity flux field in the central axis or any combinations thereof and this information can be usefully applied in the manufacture of materials designed to perform specific electromagnetic functions.

In a more complete electromagnetic structure there may be hundreds of nodes and domains arranged in various types of lattices. FIG. 5(*iv*) represents just two similar type domains as though they may be isolated out of such a lattice. Normally there would be many other conductors located in between & around the conductors shown and this will be described in further detail to follow.

Figure 6:
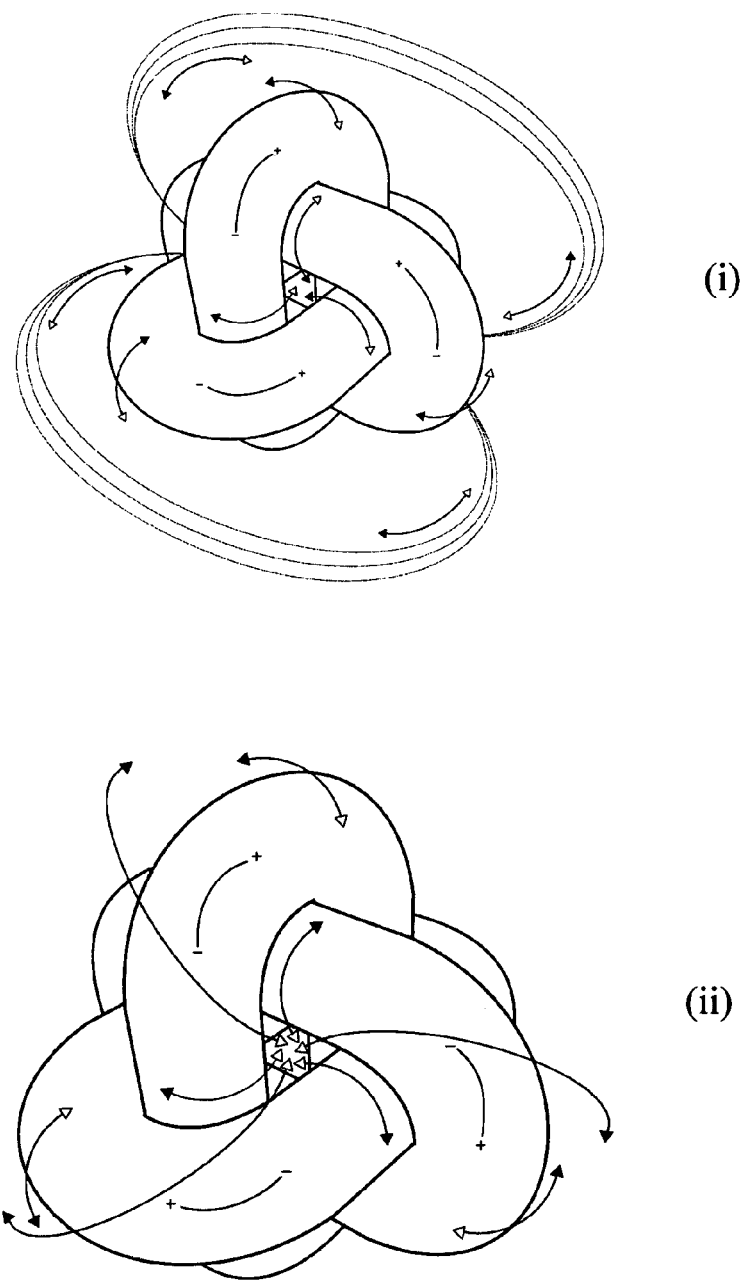
FIGS. 6(*i*) and (*ii*) are perspective view representations of three interpenetrating and perpendicular electrical conductors and the magnetic fields surrounding each conductor and their combined field.

FIGS. 6(*i*) and (*ii*) are both perspective views which represent the simplest stack of two nodes (as per FIG. 5) arranged together to form three mutually interpenetrating closed rings so that three discreet and fully resolved electromagnetic circuits co-exist around a single common polarised axis. FIG. 6(*ii*) is equivalent to FIG. 5(*ii*) and represents two nodes as though seen from the 'North' pole end wherein the polarity of the three surrounding conductors is the same causing the space in the centre to be entirely polarised N-S-N-S. The polarity immediately surrounding the conductor means as well as generally further away is depicted by the solid and hollow arrows in accordance with the other figures. It will be seen that locally near the conductor mean the flux remains perpendicular to the conductor means but merges to form a the collective flux pattern in the outer areas describes a toroidal shape.

FIG. 6(*i*) represents the same stack as though seen from an oblique side view from which perspective it will be seen that this side space is occupied by a one third/two third polarised activity. Howsoever a domain structure comprising of two nodes of six conductors is viewed the result is always that two diametrically opposite 3/3 polarised spaces (one North and one South) are formed and around this central polarised axis there will be three mixed spaces (2/3 North/South) and three more mixed spaces (2/3 South/North). This demonstrates how polarity and organization can arise naturally and even spontaneously in one plane or axis in any electromagnetic type structures which have perpendicular functional requirements, and also conversely it explains why electromagnetic activities create 'right and left handedness' in perpendicular functional arrangements.

This is an important configuration because it represents another of the most basic stable and cohesive arrangements in electromagnetism and in nature, and this arrangement may be considered to represent a basic form of a self-contained and self sustaining electromagnetic domain in which the space in between the stacked nodes adopts an identity such as a particle with one North pole and one South pole with an electrical current or field substantially aligned perpendicularly around it.

Individual domains would however, be orientated by, and gravitate towards and join up with other domains within their fields of mutual influence in their vicinity and consequently collectively form a more energy efficient close-packed polarised cluster.

It is useful therefore, to describe in more detail the domains and alternative structures as already described with reference to FIG. 5(*i*). The three conductor means of the uppermost (right handed) node and the conductors of the lower (left handed) node of conductors are located in parallel planes with the electrical current travelling in opposite directions but separated by perpendicular members of other nodes. As previously stated, the polarity within the central triangular gap may be defined as being consistently S-N-S-N up and down throughout the central polarised axis of the stack. Indeed, more nodes may be stacked above and below those illustrated thereby forming multiple layers of domains such that the polarity still remains consistently in tension up and down throughout the entire stack.

Figure 7:
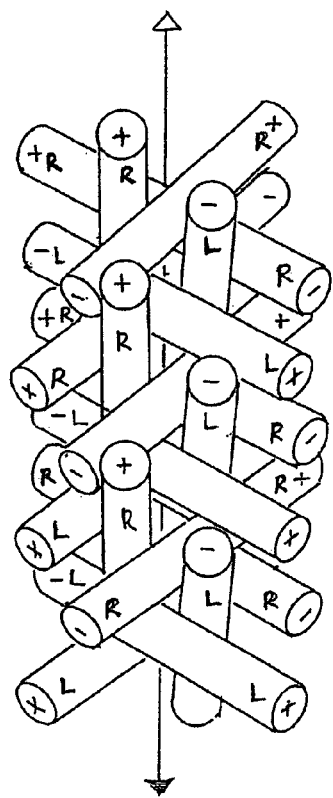
FIG. 7(*i*) is a side elevation perspective view representing a stack of conductors as represented in FIGS. 2(*i*), 2(*ii*), 3(*i*) and 3(*ii*) and FIGS. 5(*i*) and 5(*ii*).
Figure 7:
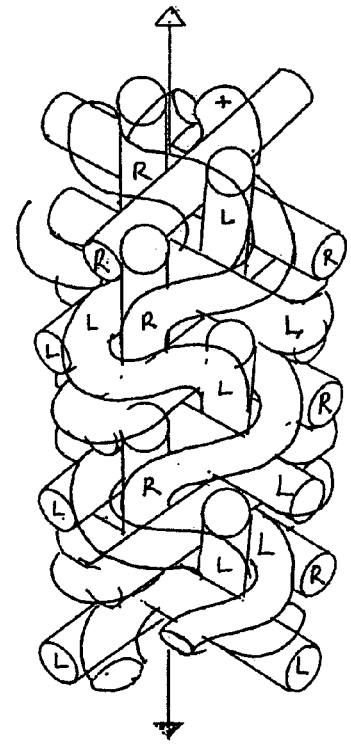
Figure 7:
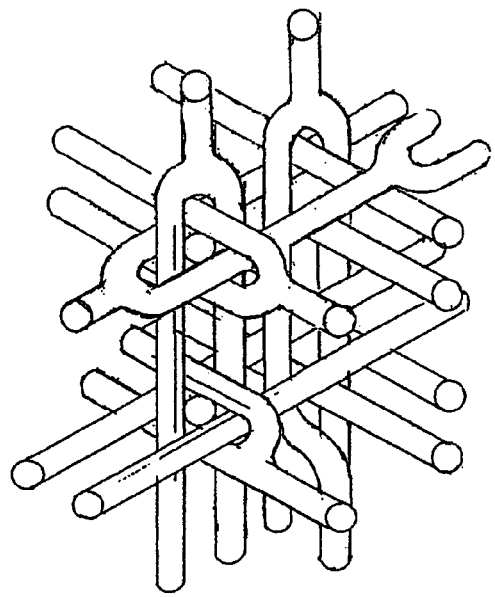
Figure 7:
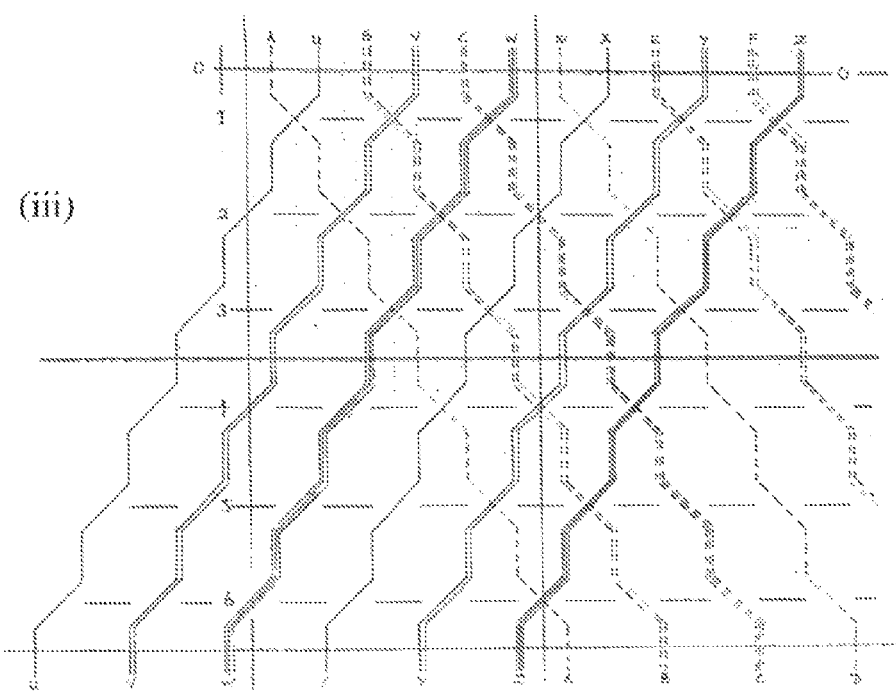

A side elevation view of a simple stack of isolated nodes is represented in FIG. 7(*i*). It should also be noted that any single node can be considered to be a one half part of the domain above, and also simultaneously each is a one half part of the domain below, so that any domain may be described as comprising two nodes each of which also half belongs to the domains above and below. This has an interesting relationship with what is known in science about electrons carrying a half charge and this information is therefore useable in the construction of electromagnetic materials. It therefore becomes self evident that the components in the stack have a predisposition to stick together as they are functionally incomplete in themselves and are simultaneously part of the nodal structure on the other sides of an intervening node, and this can be interpreted as one of the fundamental forces.

While FIG. 7 (*i*) illustrates an isolated stack of nodes forming domains it will be appreciated that this stack would normally be part of a dense three dimensional lattice such that this stack would be located and functionally connected to other stacks on every side and on each end so that collectively the electro-magnetic circuits may be completed while still adhering to the ground rules or blue-print being disclosed in this document.

The sides of the stacks present nodes which are not purely polarised and are most frequently one third/two thirds polarised as previously discussed with reference to FIG. 6. Therefore nodes or stacks in the planes extending laterally around other nodes or stacks (as represented in FIG. 1.) will not quite readily close-pack or fit together neatly without there being a space in between the nodes and parallel stacks which thereby requires the conducting means to maintain their continuity across the spaces without causing a clash in the localised associated magnetic components.

It is worth noting that if the nodal spaces in the vertical stacks are considered to represent particles such as electrons and their antiparticles positrons (with opposite charges and magnetic moments) then there would be no mechanism to prevent them mutually annihilating each other and disappearing. The requirement of all systems to 'run downhill' towards a ground state leads to an inherent 'best-fit' geometry which falls short of reaching a nadir with the result that these requirements result in the slight misfit of some nodes in the parallel plane resulting in a small space remaining between the stacks. This then maintains overall continuity in the best-fit arrangement and this then locates the particles apart as displaced half charges. Arguably if these geometrical close-packing requirements and mis-fit shortfalls did not exist as the optimum ground-state arrangement then particles and anti-particles would mutually annihilate with the consequence that no planets or matter of any kind would exist in the cosmos.

Figure 8:
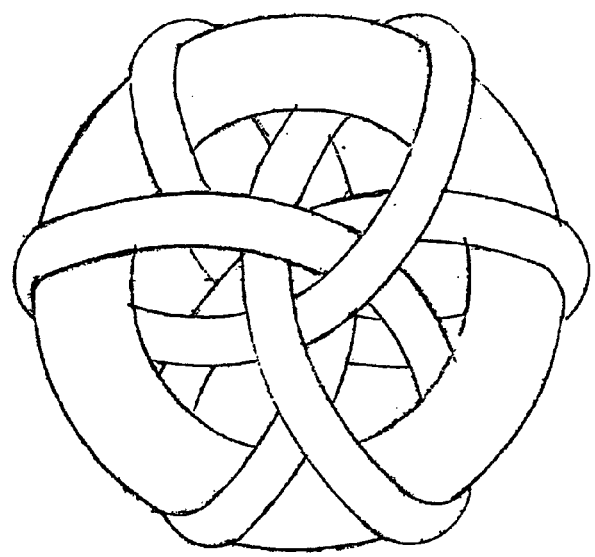
FIGS. 8(*i*) and 8(*ii*) represent two conductor circuits wound into toroidal arrangements as seen from different sides in plan view.
Figure 8:
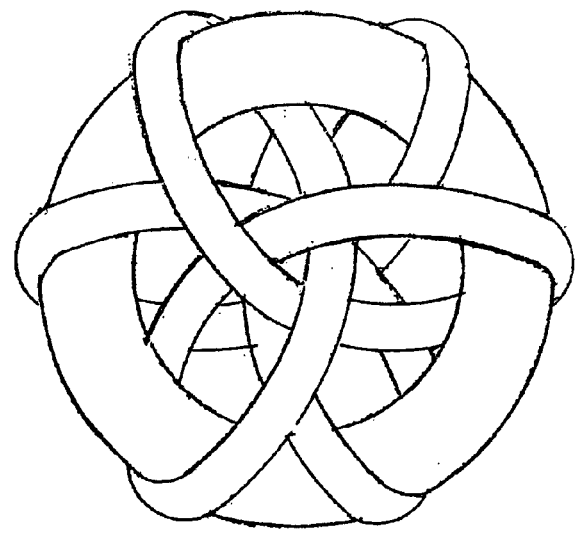
Figure 9:
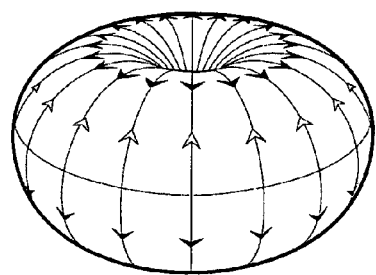
FIGS. 9(*i*), (*ii*), (*iii*) and (*v*) are perspective representations of magnetic field lines surrounding a toroidal form.
Figure 9:
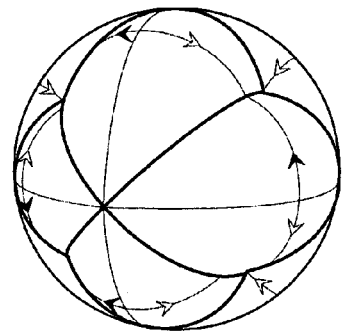
Figure 9:
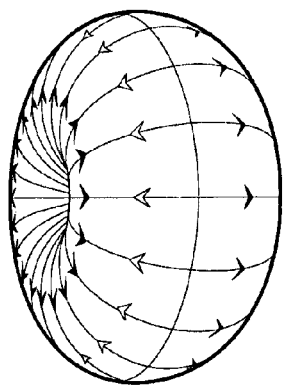
Figure 9:
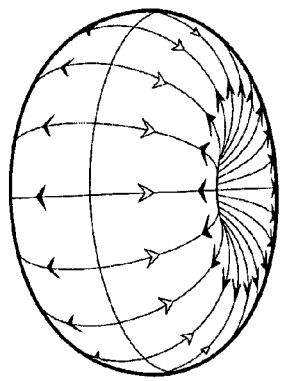
Figure 9:
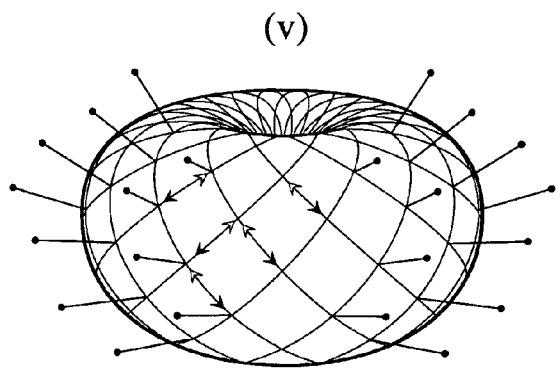
Figure 9:
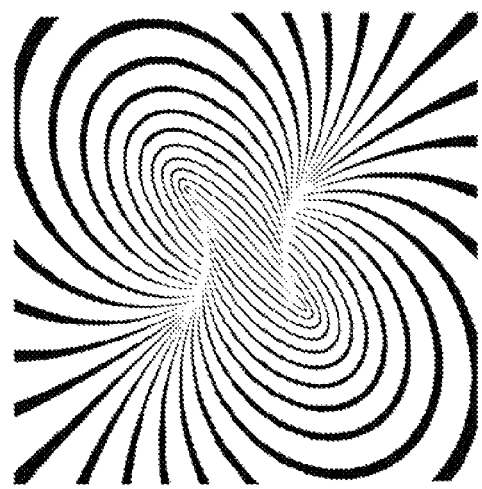
Figure 9:
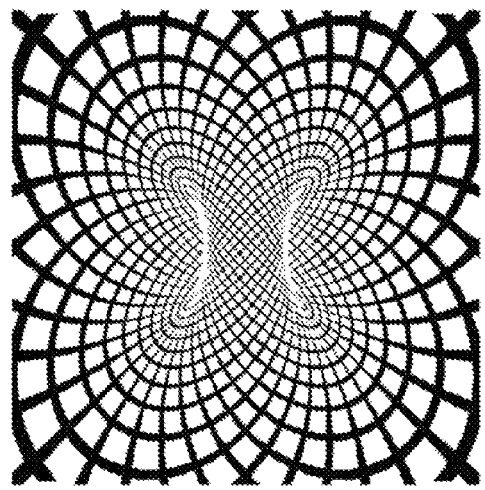

It will be understood that there are many different ways in which the circuits may be resolved as will be shown simply with reference to FIGS. 8 and 9. Indeed even the complex dynamic and ever warping circuits such as that demonstrated by the planet's magnetosphere represent multi layered electromagnetic circuits.

As an example of one way that the isolated stack such as represented in FIG. 7(i) may be defined in electromagnetic continuity with adjacent components is represented in FIG. 7(ii) in which some of the conductor means have been joined such that all the clockwise or right handed nodes have a current (or information) 'travelling downwards' and all the anti-clockwise or left handed nodes have a current 'travelling upwards'. Even in this rudimentary form it can be seen that the structure resembles a combination of two opposite sense helical electrical windings like two integrated coil windings, but in the case shown in FIG. 7(ii) all the parts adhere to strict ground rules or a 'R-L symmetry blue-print' defining which conductors 'go over' and which others are located 'under' in a specific overlap sequence such that all parts obey the left and right hand rules of electricity at all times.

In a conventional electric field winding such as in a coil of a generator or alternator, a permanent magnet is usually located so that it can be moved relatively to the coil to cut (and rearrange) the flux linkages of the magnet to produce an electrical flow in the coil arrangements. However in arrangements such as shown in FIG. 7 the flux from an ambient magnetic source may be cut and recombined through successive specific non-commutative logic gates (eg. nodes) so that there can be a progressive shunting of information (such as electrons) in opposite directions along the dual coil.

When other stacks of conductors are added on each side and on each end of the stack shown in FIG. 7(i) the end result may take the form of a complex toroidal arrangement. FIG. 7(iii) is a diagrammatic two dimensional representation of the paths of conductors through part of such a toroidal shape. FIG. 7(iii) may typically represent only a small portion of a diagrammatic two dimensional map which in three dimensional reality continues in every direction and therefore is not shown. The conductors of the right handed nodes may be represented by the dotted lines (numbered A—single dotted line, B—double dotted, and C triple dotted etc.) travelling from the top left towards the bottom right of the page, and the conductors of the left handed nodes may be represented by the solid single, double and triple lines (numbered Z,Y,X etc.) travelling from the top right towards the bottom left hand side of the page. Each cross-over point of the two sets of lines diagrammatically represents a two dimensional nodal cross-over point and for the purpose of simplicity of representing the lattice on a flat page the three conductors of each of the right (numbers A,B,C) and left hand (Z,Y,X) nodes have been separated out and paired at the cross-over points separately with the individual conductors of the opposite spin symmetry in this diagram. As described earlier, the nodes or cross-over points function as 'over-under' non-commutative logic-gates, and these are serially and progressively sequenced in opposite symmetry windings and at all times obeying all the right and left hand rules in order to usefully re-arrange or re-couple the flux linkages of the ambient flux. The straight parts of the lines in between the cross-overs can be read diagrammatically as representing that part of the conductor means which provides continuity between nodal point as for example the conductor means which loop around the outside surface of a torus. In FIG. 7(iii) the cross-overs generations are marketed sequentially 1, 2, 3, and 4 etc. so that three loops around the toroidal path could usually define a trefoil or torus knot in three dimensions which would be similar to those depicted in FIGS. 4 and 6.

In FIG. 7(iii) it will be noted that Right handed conductor means marked 'A' initially crosses over Left handed conductor means 'U' at level 1 and together with the pairs of conductors at cross-overs B-V, and C-W these relationships define a single domain of three pairs of perpendicular conductor means in the first generation of cross-overs marked '1'. After 'A' has crossed-over 'U' at '1' it then carries on to form second generation cross-over '2' with conductor 'V' and then third generation cross-over '3' with left handed conductor 'W'. Second and third generation cross-over nodes are therefore part of different domains and it will be understood that the Right and Left windings are progressively being located away from each other towards the bottom edge of the map.

This arrangement describes the serial progression of homologous elements away from a common point such that the information or energy is progressively sieved apart and it therefore represents for example a dual field coil winding in which the flux could be progressively cut and reassembled in a different new sequence without the requirement of a mechanical movement of parts caused by the introduction of an external physical power source.

FIG. 7(iii) may be considered to be like a diagrammatic local circuit map of the toroidal windings which may be completed to define its 'global' connectivity when the top edge of the page is bent around to join the bottom edge to form a 'horizontal' cylinder. This cylinder could then be duplicated and joined on opposite ends to form a long cylinder which may be used as an conductor with a highly controlled or minimal external flux field somewhat like a superconductor.

Alternatively, the two open ends of the cylinder can be bent around so that the two ends can be merged and joined to form a torus. Significantly either pair of opposite sides of the map may be joined to form a consistent 'vertical' or 'horizontal' cylinder and therefore torus in the vertical or horizontal axes, and this also reflects the duality and perpendicular nature of electro-magnetism. The map can therefore be read locally continuously in any direction or viewed globally as a cylindrical or toroidal surface comprising of circuits, or parts of circuits, or groups of circuits. It is known that this type of torus is sometimes known as a square torus because it is isometric to a square with a side length $2\pi$ with opposite sides identified.

At least some of these circuits in the toroidal arrangement may form types of Mobius strip linkages of opposite twist symmetry. For example, the Mobius strip circuit may have just one (or many more) half twists approximately following the surface of a torus before it winds back to where it started from and joins up into a circuit again. By the time all the conductors in FIG. 7(iii) have undergone six cross-overs (as illustrated) they can be back in the original order but they will have been side-shifted downstream six places so that 'A' is now located vertically under 'D', and if the page is rolled into a horizontal cylinder 'A' can in fact become a (sideways displaced) 'D'.

Whether the 'twists' form a Mobius connectivity, or otherwise, depends on the number of half twists in the circuit, because 'odds or evens' numbers of twists can define the functional topology of the circuit. In the case of large systems like a planet's magnetosphere it is highly unlikely that the system's connectivity neatly describes any simple Mobius half twist topology and there may be many millions of odd or even numbers of twists. However, the circuits will resolve their down hill energy requirements as economically as possible on an ad hoc basis as and when any convenient connection possibility is encountered which permits an apparent downhill step. There is a strong possibility that at least half the circuit arrangements will include a Mobius topology connectivity since there is at least a fifty percent chance that any electromagnetic circuit can achieve suitable connectivity after either an odd or an even number of half twists and by default the nodes will close-pack and domains will be formed. Moreover, the probability of forming appropriate connections to close-pack is more than 50% since, and in line with the laws of thermodynamics, there is a predisposition for components to 'gravitate downhill' towards an energy ground-state or equilibrium which is most easily achieved by way of the completion of electromagnetic circuits close packing in tension.

References made to terms such as 'toroidal and Mobius structure' should not be read as implying any precise toroidal outer boundary limits describing a two dimensional surface covering the volume of a torus. As with the Earth's magnetosphere, the electromagnetic activity within a toroidal space is mainly in tension in the 'two' dimensional substantially concentric parallel planes following the shape around the torus (as illustrated in FIG. 9(v) to be described in further detail later). The main force of tension which drives the toroidal arrangement is permitted by the close-packing of elements towards an apparent ground-state in the central vortex or core of the torus. This is due to the hyperbolic structure in the core vortex which provides a suitable geometry and topological re-connectivity including straight line generators (through the central vortex or core) and the topological trick of mobius re-connectivity in a staggered non commutative sequence. The structure therefore appears to be running 'down hill' towards a ground-state 'locally' in the central core although a dynamic equilibrium is preserved 'globally'.

FIG. 9.(vi) is a perspective representation of the inside of a torus showing the flux path spiraling through the central vortex and out around the outer body of the torus. It will be noted in FIG. 9(vi) that for clarity the flux is illustrated as spiraling in one rotational spin direction only but the more complete representation is seen in FIG. 9(vii) which shows contra-rotating flux spin directions from the same internal perspective as that seen in FIG. 9(vi). This contra-rotational representation accords with the contra-rotational spin direction represented by FIG. 1(vii) showing the straight line helical version which is similar to the structure of the cylindrical central vortex area of the torus.

Broadly speaking the inner hyperbolic vortex drives the close packing of elements efficiently and is mainly in tension and extending the force of tension into the planes around the outer body's convex layers or 'skins' of the torus. Perpendicular to the toroidal layers or 'skins' which are in tension the field could be described as being in compression as like elements are bent around to face each other and are therefore mutually repelled without the benefit of sidestepping the requirement through a devious Mobius topological connectivity. For this reason the flux around a bar magnet or a magnetosphere spreads outwards indefinitely becoming ever weaker. While the toroidal form is described as being solid like an apple in layered skins it should be noted that these skins are not concentric layers or shells and the elements interact three dimensionally and therefore change relative 'altitudes' during each orbit around the outer areas and through the central vortex of torus.

To clarify the above however, if the toroidal arrangement is considered to approximate to a series of concentric two dimensional shells in tension around an annulus then the torus would normally also be mainly in compression in the third perpendicular plane extending from the inner core axis radially outwards (approximating to a gravitational plane in compression). The three bent perpendicular vectors of the circuits thereby maintain a dynamic equilibrium which reduces in force density progressively away from the main central core or axis in the outer convex portion of the torus where there is also reduced tension along the substantially spread out concentric shells. Again it should be noted that the conducting means or elements within the toroidal arrangement do not strictly follow the paths of exact concentric shells or rings around the annulus and therefore the paths may be located towards the outer surface of a torus in one place and yet dive deeply through the central vortex on a subsequent orbital loop as can be seen in the very simplified versions illustrated in FIG. 8., which will be described in further detail later.

In order to maintain a 'downhill trajectory' towards a global equilibrium or ground state the total amount of energy and information becomes accelerated or conducted along the straight line generators passing through the close-packed central vortex of any electromagnetic materials within the toroidal core structure. This then requires and causes the energy and/or information to become resolved internally either within the toroidal circuits of its own discreet structure or externally with reference to any other more available external magnetic sources. In the absence of nearby structures a magnetic flux field may therefore spread outwards indefinitely becoming ever weaker but still resolving most of its own information and forces—as is seen in the Earth's own magnetosphere.

When the same sort of natural geometry and topology is mimicked artificially in order to be applied to technological devices, the Mobius/toroidal topology (outlined in FIGS. 1-7) can be manipulated along with the different symmetries of the nodes (eg. FIGS. 2 and 5) to provide serial and progressive 'logic gates' which collectively may be used to disassemble or decouple and 'unravel' and then re-couple and re-arrange the electromagnetic components in a different order to mimic the cutting of flux lines in order to provide a cumulative electrical potential and to use any available energy for various purposes as though, for example, the magnetic source was an electromagnetic source or a capacitor.

The diagrammatic 'road-map' arrangements represented in FIG. 7 along with the other diagrams therefore describe a method of producing electromagnetic pathway systems and circuits which can describe, for example, efficient elongate windings or provide highly efficient conductor means which internalise the flux field and therefore exhibits very little wasteful external magnetic flux. Alternatively, the total continuity of the road-map or electromagnetic system may be designed such that instead of it ultimately forming a long woven cable (or crystallographically based) electromagnetic conductor means it may also describe a dual coil (or part thereof) in which (as described above) the electromagnetic components in the surrounding ambient flux field are decoupled into two groups defined by the direction of current flow and 'spin' symmetry and such that a useable electrical potential is built up between the two circuits. Typically the two circuits may be joined at one end (eg. of the field coil in the flux) and the useable electrical potential can therefore be extracted from the two other 'free' ends so that the circuit resembles, for example, a battery in which the cells have been replaced with dual back to back opposite symmetry coils in an ambient flux field as described above and below. In line with laws of thermodynamics the ambient flux field should be expected to become degraded to at least the extent that some potential energy is extracted. The conductors may be joined back to back, for example in FIG. 7(iii) along the line marked 0-0 at the top of the page to a mirror image version so that the free ends occur along the top (not shown) and bottom edges. Naturally these may be linked up in series or parallel in known ways or combined or split progressively as can be done with known topology connectivity such as Mobius strip topology.

The winding arrangement maybe further described with reference to the well known simple electrical solenoid type coil which may be wound as a right or left handed spiral with very specific functional implications. When a specific electrical current is applied from an external source into a right or a left spiraling coil this defines the specific polarity orientation in the magnetic flux emitting from the open ends of the coil which in turn will cause a permanent magnet in the vicinity to be orientated or moved in a specific direction relative to the winding direction and the direction of current. Conversely, as is well known, the applied movement of a permanent magnet of specific polarity in the vicinity of a specific directional helical winding is said to cut the flux lines to produce a specifically directional current. This geometry involving the multiple symmetries and asymmetries of electromagnetism is well defined by various known rules and laws such as Lenz's right/left rules used in everyday electronics.

With the exception of solid-state devices such as those used in photovoltaic arrays it is usually the case that to produce electrical power a mechanical force has to be applied to the hardware to build up an asymmetrical result which is manifested as an electrical potential at the terminals. The blueprint system and subject of this patent application works on the principle that electricity comprises of two asymmetrical parts which collectively define a single axis of polarity but whose components are normally geometrically and topologically locked together and may only be de-coupled usefully when 'the road-map' is applied. In these situations, as in the case of photovoltaic technology, it becomes unnecessary to introduce the normal requirement of external effort to cause the dislocation and de-coupling to cause an electromagnetic bi-asymmetry which results in the production of a useable electrical potential.

Although it is normally useful to provide a road-map which ensures that a single directional polarity axis runs only one way through a structure (as contiguous N-S-N-S-domains etc) there are other useful alternative arrangements which may be designed in which the adjacent parallel conductors may carry current in the same direction in various locations of the lattice through the alternating right and left nodes. It is also possible to arrange nodes or logic gates so that one or two of the conductor means may be re-located locally in the lattice to provide a node or logic gate with mixed polarity or a polarity turning through right angles such that the polarity can be interrupted and even reversed at any point throughout the length of the stack, for example to design different structures which may be used in crystallography, or other situations or a quality which is required to provide the desired chemical attributes, for example to improve conduction in higher temperature materials, or to build composites similar to those used in the manufacture of photovoltaic cells but which can derive electrical energy directly from an ambient magnetic flux source. More conductor means may be added in all three spatial directions to form specific function three dimensional lattices and by manipulating their left/right nodal symmetry relative to the direction of electrical flow, or by splitting or pairing conductive means to act together or divide into other pairs of conductive means as shown in FIG. 7(*iv*). Accordingly this document should be seen as a 'road-map' or 'blueprint' system with which to outline the mechanics of electromagnetism to facilitate the design of certain electromagnetic materials or devices.

FIG. 7(*iv*) therefore represents a typical and non specific collection of ways in which conductors may be split and recombined or diverted around others to alter and control the local flux paths around and in-between the conductors in order to provide a specific overall flux arrangement which do not exhibit any substantial external flux or act as a diode or a logic gate in an information storage or processing device. Each conductor in each node has highly specific non-commutative relationships with adjacent members at the central common axis as represented in FIGS. 2 and 3 but when viewed from the side elevation (eg. FIG. 7(*i*)) nodes appear mixed without a common axis. This can be optimised by bending, rearranging, splitting and recombining of selected conductors locally so that each conductor presents the correct flux code to the perpendicular conductors it passes according to the material or chemical requirement.

When nodes are stacked into piles as in FIGS. 7 (*ii*)(*iii*) this inevitably suggests there may ultimately be specific functional ends of the structure, such as the exposed North and South polar faces which are measurably different but are required to remain in magnetic continuity with each other via a flux field, as is the case of the simple bar magnet. In this instance, it is known that there is a magnetic flux extending from the North polar end seeking the flux from the South polar end and visa versa, such that a substantially continuous magnetic circuit (is in tension and) bends around externally of the main body of the magnet to complete the magnetic circuit as best it can. It is considered that part of the magnetic circuit which is located within the body of a magnet is the active driving means which by itself is unable to resolve it's energetic forces internally and therefore has to energise and drive an external flux field in the passive gap or space in between the polar faces which exhibit the flux. Since the external space is the passive part which is being 'pushed' (by the active part within the magnet) the passive part of the circuit assumes an opposite polarity to the active part in order to complete the circuit in the external space in the absence of appropriate permeable or magnetic material. This situation is directly analogous to the reversed functions of say an electrical generator to an electric motor. The more solid permeable part of the magnetic circuit can therefore be likened to the actively close-packing hyperbolic portion of the toroidal core structure (as described in this document) such that the central vortex part of the torus is highly efficient (and in tension) and such that it actively motivates or drives the more passive outer convex part of the circuit in the surrounding space which only functions to bridge the gap and reconstruct the necessary topological connections within the geometric constraints.

It is also well understood that a solid bar magnet however can be made without any substantially exposed 'polar ends' if the magnet is constructed in parts or bent around to form a closed magnetic circuit, and in this arrangement very little external flux is detectable, as in the case of superconducting materials. This kind of closed magnetic circuit may for example sometimes take the shape of a ring or anulus and the domains within it may be aligned in the direction around the circumference or the equatorial girth of the anulus with the North/South axis embedded within the circle or ring.

Alternatively and in accordance with the description associated with FIG. 7(*iii*) the magnetic components may become aligned at right angles to the above example so that the common North/South axis is split down through the middle so that it runs concentrically through a constricted 'hole' in the centre of the torus and around the shortest pathway towards the other pole end. This arrangement may be considered more satisfactorily from an energy and geometrical standpoint than the annulus arrangement described in the previous paragraph.

FIG. 8(*i*)RL and 8(*ii*)LR represent a very simple electromagnetic torus in which the polarity is split down through the central hole and vortex. These figures illustrate a simple stack of two nodes such as those represented in FIGS. 5(*i*)RL and 5(*ii*)LR however in FIG. 8 the conductors have been bent around and joined end to end to form two electromagnetic toroidal circuits in a more completed domain structure. FIG. 8. therefore are the logical developments of FIG. 5 and the trefoil/toroidal knots described with reference to FIG. 4. For clarity only and to better demonstrate the toroidal circuits, the drawing in FIG. 8. include a hypothetical toroidal/annulus structure which the clockwise and anti-clockwise conductors are woven around. It can clearly be seen in FIGS. 8(*i*),(*ii*) that the conductor means spiral around the torus and close pack in a double, reverse spin non-commutative and polarised best fit sequence through the central hole The electromagnetic toroidal structures such as those illustrated in FIGS. 6 and 8 may be described as the simplest best-fit low energy or self sustaining ground-state structures. A much more complex natural example of this type of toroidal magnetic circuit is created by the Earth's magnetosphere which is also known to be substantially toroidal with the North/South axis located approximately through the filled-in 'hole' of the torus actively driving an external passive magnetosphere which progressively diminishes over thousands of kilometers away from the relatively small active magnetic core.

It is known that the magnetic cores of planets and stars can be very large and compromised by a variety of materials so that they sometimes become irregular and untidy with magnetic storms occurring, however, they may be generally considered to be functionally similar to other magnetic sources and should be governed by the same basic physical laws in space and time as minute magnetic particles, domains or electric and magnetic charges and point particles. For the purpose of this patent application the descriptions are limited as much as possible to the more practical aspects of the invention in the context of electromagnetism with reference to minute magnetic nodes, particles and domains, but it should be born in mind that even the planet's magnetosphere represents a potential source of useable energy as it maintains an energetic magnetic field. Therefore when the components of electromagnetism are correctly interpreted, as defined by this document or patent blue-print, the magnetosphere or any other electromagnetic flux may provide a useable or harvestable electrical energy source in a similar way to photo-voltaics or by way of the harvesting of electrical energy in the atmosphere as is often evidenced by sporadic discharge of lightning, which it should be noted is continually re-powered by the sustainable energy source of the magnetosphere in the radial 'compression' plane.

It is significant that the magma within the Earth is apparently perpetually energised such that it has moved for billions of years and still continues to move slowly creating friction within the core and thereby providing and radiating heat outwards through the Earth's insulating crust which is the layer which is solidified or 'frozen over' by the continual net loss of heat to the atmosphere and space. It is also significant that an electrical potential is built up in the radial plane of the toroidal magnetosphere such that at the low levels the atmospheric damp conditions sometimes provide the appropriate conductance paths for the generated electrical energy potential to relieve itself in the form of lightning events which are especially spectacular in the radial plane towards the central equatorial regions of the planet.

The reasons for this will become more apparent with reference to FIG. 9. However, it is one of the tenets and claims of this patent application that electrical energy is harvestable by providing a lattice based on the blue-print hereby disclosed and made of the appropriate permeable and conductive materials such that the substantially vertically orientated electrical potential and horizontal magnetic elements can be usefully re-coupled and subsequently discharged into a power grid, for example. Large panels of parity discerning electro-magnetic de-coupling lattices may be constructed according to the guidelines disclosed using special crystallographic materials based on silicone, carbon, caesium chloride and various piezo-electric compounds, and/or nano scaled structures specially arranged to take advantage of the Casimir effects, to mention but a few. Such sensitive and harvesting electromagnetic panels may be properly orientated within walls and roofs of buildings or within the landscape in order to filter out some of the electrical potential continuously being built up in the ambient magnetic source which measures approximately half a gauss. Additionally high gauss strength permanent magnetic sources such as rare earth magnets can be fabricated into or cast in and around parity discerning, or electro-magnetic de-coupling lattices such that these may be used as fixed or transportable power sources, and which when used at low discharge levels could be considered to act as extremely sustainable and long lasting batteries.

When a toroidal magnetic circuit (the N/S axis is split down through the middle and is located through the central 'hole') is made of a suitable quality and combination of materials with the appropriate magnetic permeability and electrical conductivity the flux may be substantially retained within the body of the magnet, and although not much external activity is always discernable it may be assumed that there is three dimensional dynamic electromagnetic activity still taking place within the body of the torus, as is the case with superconductors which display no discernable external magnetic flux.

All the electromagnetic activity such as the propagation of electromagnetic waves or so called electron movement 'travelling through' the individual nodes in a magnetosphere or a simple closed circuit domain as represented in FIGS. 8 (and 9) may be considered to be running 'downhill' in one direction relative to the direction of waves or electrons in other contiguous nodes (i.e. they do not gain or loose net energy) in an attempt to achieve a better close-packed equilibrium ground-state within the field. As a result of the devious topology and geometry of space (being described in this document) this can only be accomplished by each electromagnetic element 'gaining traction' against perpendicular polarised parts by running neighbouring parts in the other perpendicular axes which may appear to be running 'uphill' relatively to the first axis, and visa versa, such that all electromagnetic components in all three dimensions appear be running 'downhill' within their own frame of reference but 'up-hill' relative to their perpendicularly adjacent counterparts and all within the context of time. This may be better understood with reference to FIG. 8 and the explanation below.

As there is no empirical experience to describe the mechanics of the self sustaining toroidal electromagnetic system it is useful to draw on an empirically understood analogy to explain the concept of 'running down hill along the lines of least resistance and gaining traction in different planes' in space. Therefore a simple analogy can be drawn by describing the case of a sailing boat on water or an ice-skater on blades on ice, both of which supporting surfaces for the present purpose may be considered to be near frictionless surfaces without any tractive qualities in the one (long) axis of the blade or keel but resistant to movement in the perpendicular lateral axis. Free-space would therefore be similarly isotropic being equal, identical and invariant under rotation, but free-space is isotropic in all three dimensions instead of the two as in the analogy. When ice-blades (or electromagnetic elements) are positioned approximately at right angles with respect to each other, the first element can be 'thrust' (say forwards) or gain traction relatively against the sideways resistance of the other perpendicular element, and then the second element can be thrust forwards against the side resistance of the first so that when the two elements are related a net result can be achieved in time in which a common mass can be accelerated in the substantially average direction with reference to the two dimensional stationary ground plane which in itself provides no traction in the required direction of movement.

In the case of electromagnetism there is no static two dimensional reference ground plane or background field that provides any means of lateral resistance and traction, and in space-time the system has to function within a uniform and isotropic three dimensional spatial field in the causal context of time in a best fit close-packing sequence in tension relative to creating a self defining spatial reference system.

Therefore electromagnetism (or any other fundamental force in nature) inevitably provides its own localised relative reference field by default which can be a total three dimensional autonomous system in itself with activity in each dimension providing traction for the other two in turn. In its simplest three dimensional form, any spatial definition system should only be permitted to exhibit functional relationships within real space-time for which an empirically understandable model such as a mechanical analogy can be constructed.

Electromagnetic activity maybe defined in terms of three mutually perpendicular component members, each component member comprising of a pair of 180 degree opposite value relative vectors. Each pair being located so that it penetrates in between the adjacent perpendicular pair of vectors so that each pair penetrates the next on one side in a rotational sequence. Since all the vectors are relative they may be considered to provide a suitable method with which to collectively define a point of space such as a nodal position or the relative location of an elementary particle or charge for example.

Each of the pairs of vectors is required to complete electromagnetic circuits by way of functional relationships with adjacent external elements within the field externally or by way of self-closure of the circuits (as illustrated in FIGS. 6(*i*)(*ii*), and 8(*i*),(*ii*)). Empirically FIG. 6 can be understood as three sequentially penetrating locked chain links, each carrying an electrical current around the links and exhibiting a local magnetic field which collectively merges into an external 'global' toroidal magnetic field.

Three such chain links carrying current in any direction would automatically define an electromagnetic structure which may appear identical from several different external views but which would never-the-less self define only one specific magnetic axis passing through a central point or space which could be described as the centre point of a magnetic domain or an elementary particle or point particle.

In order to maintain an overall equilibrium therefore, the elements are caused to sequentially interpenetrate (cf. FIG. 4, 5) the adjacent perpendicular member and this in turn requires that the isotropic field has to be divided into discrete bundles or quanta which can only maintain continuity in the dynamic circuit by adopting a stop/start over/under stepped sequence or 'highway' code in order not to crash one another as they interpenetrate in turn. This then enables the electromagnetic elements or quanta to pass-by or close-pack minimally, or pause and transfer flux when crossing over each other's paths sequentially in an ordered manner in the central vortex area. In this way the overall structure is able to maintain a 'global' equilibrium or apparent ground state as will be expanded upon later in this document.

The relative 'motions' of the quanta is therefore like the sequential thrusting of perpendicular ice blades or the sequential tacking of the sailing boat, however in the case of electromagnetism the three dimensional exchange of flux and electromagnetic energy between each perpendicular member carries one half of each of the 180 degree pairs to a level 'above' and the other half to the level 'below' the mean or average starting point and after only three right angle turns the members would appear to be able to have completed one circuit. The close packing sequence can only be accomplished in three dimensions using hyperbolic geometry wherein the relative positions twist and interact along the lengths of the straight line generators.

Another useful analogy to the three dimensional functionality of electromagnetism may be drawn by defining three flights of elevator-stairs at right angles spiraling around a central axis which can be considered to represent the axis of polarity (say North equates to upwards, cf. FIGS. 2, 3.) A series of people may be standing on each step of each of the elevator stairs and their combined weight is pulling down on the elevator such that this pulls the continuous elevator belt upwards on the other under side hidden from the people on the topside. Each elevator belt is mechanically meshed perpendicularly such that they all move together.

On the 'landings' at the corners of different levels the passengers have to pass each other which requires them to close-pack by twisting and turning sideways sequentially to avoid crashing, or they could be made to pause and wait giving precedence to passengers on one side, say obeying the right and left hand rules for example, as vehicles may do at the traffic lights. After passing each other on the landing the passengers find themselves at the top of another elevator and carry on descending and so forth (cf. FIG. 7).

In the case of electromagnetism each elevator could also be described as a continuous belt like three chain links (FIG. 6) or one continuous looping system as described with reference to FIG. 8. While the persons described as descending the escalators are generally descending towards the 'South' there may be additional unseen persons on the underside of the escalator belt travelling in the opposite direction. In a normal gravitational context the persons on the 'underside' of the belt would be considered to be going 'upwards' but in the context of magnetism where 'up' and 'down' has no meaning they would also be described as travelling ('downwards' but) in a Northward direction, and as such all parties would consider their own downward motions to be partially responsible for moving their perpendicular and unseen colleagues in their appropriate directions while still obeying the laws of thermodynamics.

Naturally the linked escalators would grind to a halt if the persons' weights could not eventually be carried over on the other parallel side of the escalator belt so that they could continue 'descending upwards' relatively.

In the electromagnetic context the elements which are equivalent to the elevator belts are of course extremely flexible and malleable and are therefore able to twist, bend, separate and re-combine and close-pack through a series of tortuous topological and geometrical arrangements to permit some collective switching of polarity values. Furthermore the central core or vortex permits three dimensional close-packing in tension and conduct flux transfers in a concentrated area where hyperbolic geometry functionality exists, whereas on the outer convex surfaces of the torus at least one of the three spatial axes is caused to be in compression and thereby spreads into a very large or infinitely large volume of space. There is therefore a built-in 1:2/3 imbalance and natural turbulence in the mechanical functionalities within the natural geometry and fabric of space-time and this is one of the root causes of the back ground radiation and the theoretical but illusive 96% dark energy and matter. Understanding the structure of space-time provides the basis of designing any blueprint which can be used to manipulate materials with specific properties.

It will be understood then that each electromagnetic element or member such as a conductor may be in a non-commutative perpendicular relationship with its adjacent members of similar spin symmetry but each member is also located parallel and therefore 'moves relatively' in the opposite direction relative to its twin member of opposite sign and belonging to the group of three of the opposite spin symmetry, such that each member can define a plane in which it can 'gain traction' or run 'down-hill' relative to its parallel twin, and such that it can sequentially bear down on perpendicular members, and so that collectively each group of three (of opposite twin pairs) can also 'run-downhill' within their own frames of reference using the other three to provide 'tractive purchase' or a 'hill' to run down upon thereby requiring and using all three spatial axes in the context of time. This type of arrangement as represented in FIG. 8 therefore probably represents the simplest and most generic working configuration that enables an entire structure in space-time to apparently remain in a sustainably running down energy trajectory and dynamically 'cold cycling' within its own frame of reference.

To clarify the above it can be paraphrased as follows; each of the three members of each node 'gains electromagnetic purchase and traction' on the adjacent perpendicular ones in a cyclic or rotational non commutative sequence such that each one gains traction in tension or purchase in compression in a different specific direction with the adjacent one on either side. Each member, therefore has a different functional relationship with stepped up/down perpendicular members above and below itself at any given location, and each of the two groups of three opposite right/left spin symmetry collectively gain traction against each other and collectively are motivated by the spatial requirement to close-pack economically which requires three electro- and three magnetic part-sets of components to complete their circuits in a continuous stream of parts or quanta in a substantially perpendicular configuration which requires the electromagnetic circuits to bend around and inter-penetrate and exchange flux sequentially in a hyperbolic vortex or helix in the central portion of a toroidal arrangement. This can be understood with reference to the above Figures such as FIGS. 4(i), 7(iii)(iv) and FIGS. 8(i),(ii). in which it can be seen that because of the inherent geometry of the perpendicular arrangements (cf. the right & left hand laws of electromagnetism) and when applied in the toroidal context results in a systematic build up of a specific non commutative relationship between the direction of electrical flow and magnetic flux direction.

In the example shown in FIGS. 5 and 8 wherein a node of three elements represents three conductors and the node is located in a close-packed arrangement next to another node of the opposite spin symmetry, the electrical current within the twin parallel and adjacent members or conductors normally travels in opposite directions and therefore provides a space and time mutual reference system to initiate relative 'movements' (electromagnetic or electromotive force cf. 'a hill'). Each set of nodal junctions comprising of six conductors therefore collectively define one domain which is structurally 'boxed in' and locked as a cohesive unit. Further domains may then be stacked above and below (and around) to further 'box-in' or 'lock-in' the structural integrity of the electromagnetic system. While two nodes comprising of six perpendicular elements as depicted in FIGS. 5 and 8. may be called a 'domain' it should be noted that the clockwise and anticlockwise spin nodes immediately above and below have similar relationships with the neighbouring upper and lower opposite spin nodes and these therefore also form domains above and below so that each node is common to the domains above and below such that the system can be described as a series of half charges, with spin directions (like an electron for example) and such that each half is related to another half on either side so the arrangement is naturally locked together like the known fundamental binding forces of nature.

In most situations a single domain (cf. FIG. 8) would be attracted to or manufactured such that domains can be stacked with a continuous N-S-N-S polarity running up the common axis although this arrangement may be mixed and matched to provide alternating domains or conductor means which may combine and split repeatedly within a matrix. FIG. 7.(i) represents a single isolated column or stack of nodes and domains such that the polarity in the central common axis runs consistently North seeking from the lower end to South seeking at the upper end so that the components or nodes of the entire column may be considered to be attracting their adjacent nodes in the vertical plane in a state of tension throughout the stack.

In the FIG. 8 the inner portion represents the hyperbolic inner part of the torus while the outer more curved portion of the trefoil elements follow the outer convex portion of the torus. The circular form diagrammatically represents the main body of the torus, and more electromagnetic components would normally be located within this toroidal space. As mentioned above, the toroidal arrangement of the three pairs of perpendicular electromagnetic elements in FIG. 8. represents another slightly more complex version of the electromagnetic locking knot and this close packing arrangement provides one of the features of the fundamental binding forces in nature and which 'glues' matter together at three levels; firstly the central overlap sequence with current travelling in opposite directions creates a three dimensional locking structure and the trefoil knot is a known topological knot and therefore is a true lock and thirdly the two trefoil knots are themselves double knotted together around and within the body of the torus.

It is to be understood that the geometry of the torus comprises of two basic parts, the first, on the outer portion, is synclastic or bi-convex (convex in both perpendicular planes on one side of the surface). A convex geometry membrane (eg. a balloon) defines an 'inside' and an 'outside space'. Convex geometrical structures are typical of the natural geometry of forces of compression and concentric expansion cf. structure of a dome, arch, egg and mushroom, cauliflower, nuclear bomb.

The second and inner part of a torus is the anti-clastic or hyperbolic portion which is both convex and perpendicularly concave on both sides of the surface. The hyperbolic or anticlastic part forms the geometry of the inner surfaces or parts of the torus which naturally forms the dual concave/convex area leading down through the hole through the centre. Being hyperbolic, the inner surface of a torus comprises of a geometry including straight lines (straight line generators) which represent the shortest distance between points and this geometry is typical of tensile structures such as spider webs cyclonic vortexes or the structural steel work cast in tension within power station cooling towers etc.

In the torus the central helical area enables the minimal close-packing (energetically 'downhill') geometry for structures to function best. This combination in a torus of the convex portion being in compression and the hyperbolic portion being in tension is one of the features which enables the driving cold-cycling force of the entire structure. The hyperbolic portion therefore encourages acceleration and the economically ordered close-packing in tension while the outer bi-convex region of the torus resists this and may be considered to be in compression in the radial plane like the volume in a soap bubble while the surface membrane of the bubble is in tension and in communication with the hyperbolic portion.

The persuasive dynamics of the inner type of hyperbolic geometry is also evidenced in many other natural forces ranging from tornados, waterspouts, whirlpools, DNA and magnets themselves. The central part of a toroidal structure may therefore be considered to be the most natural three dimensional structure which enables the causal resolution of forces of compression and tension, within a context of time. It is evident that the qualities inherent in the hyperbolic and bi-convex geometries is normally scaleable without loosing general meaning in the same way as fractals may be indefinitely scaled and also in a similar way to holograms in which any part of a hologram may contain information of the whole.

FIGS. 9 (i) (ii) (iii) represent three toroidal forms arranged with their three main axes being very approximately mutually perpendicular with respect to each other, and such that their N/S polarity lines follow straight around the girth of their minor circumferences. FIG. 9(iv) represents the combination of the three tori of FIGS. 9(i),(ii),(iii) as if they were merged in the same orientation as 9(i),(ii),(iii) but also in the same location, so that they are arranged perpendicularly relatively to each other. This is an unstable arrangement, however, as the overriding resolution of the forces involved requires the elements to close-pack in tension where ever possible resulting in a more economical energetic arrangement.

In practice the most efficient resolution is that any two of the three tori may functionally merge into the same toroidal space whilst still maintaining their perpendicular electromagnetic identities relative to each other. While they share the same toroidal space this is somewhat at the expense of the third torus (or the third perpendicular axis) the elements of which attempt to remain perpendicular. FIG. 9(v) therefore represents a best-fit compromise situation in which two tori have joined together to contribute to the same toroidal form and volume thereby dominating the third perpendicular torus which looses its convex connectivity in the outer convex portion. The residual elements of the third torus' main axis are represented in FIG. 9(v) by the 'pins' located in the perpendicular plane to the other two spiraling axis which follow the surface or volume of the combined torus.

Two out of the three tori can therefore combine forces by contributing to the geometrical requirements in one toroidal space while still maintaining the correct perpendicular relationships of elements throughout the entire volume of the shared torus resulting in an optimum overall arrangement for efficiently close-packing in opposite spiral paths down through a single central vortex/axis where the components are required to interpenetrate to maintain the global equilibrium and correct topology. The perpendicular components also substantially maintain their perpendicular local relationships all the way around and back on the outside as can be seen in FIG. 9(v). Plainly this is a best-fit compromise which permits an apparent consistent energetic run down hill towards a ground-state and which establishes a 2/3 'majority rule' slightly at the expense of the global connectivity in the third dimension. The two dimensions that share the same toroidal volume are able to resolve their forces reasonably satisfactorily by remaining in tension and at 90 degrees while the third axis is compromised and is orientated radially so that it faces the core of the central axis and as such it remains in compression as it directly faces a mirror image polarity through the core. Since this 'axis' therefore is self repelling in compression radially this results in the volume of the torus gaining volume such that as the forces of tension in the concentric shells around the torus decrease with distance from the core so does the force of compression in the radial planes causing the volume of the toroidal form to increase inversely proportionately with distance.

The forces of tension and compression (in this compromised geometrical arrangement of the torus) result in a discrepancy or imbalance which drives the structure as it ever seeks to achieve an equilibrium ground-state without actually ever achieving a three dimensionally symmetrical resolution which totally obeys the previously known concepts of spatial parity. However, since the three dimensional geometry and structure of space does not permit the forces to resolves themselves by neatly close-packing and cancelling themselves out completely, the components are therefore caused to cold-cycle, each part in an apparent 'down-hill' trajectory relative to the other members of the same spin direction but 'up-hill' relative to their opposite spin partners, and visa versa.

It is for these reasons that energy and matter are ultimately prevented from mutually close-packing and thereby annihilating each other and why the torus like a magnetosphere gains considerable dimensional thickness in the radial equatorial plane into deep space.

Naturally referring to 'running down-hill or up-hill' is merely a convenient way of describing the concept, but in terms of an energetic three dimensional system (such as electric charge) the imbalance of attractive forces of tension and repulsive forces of compression provide some surplus natural 'down hill' order or gradient when arranged in a toroidal format. Indeed, the combination of the two thirds majority bias and the hyperbolic (anticlastic) and bi-convex (synclastic) requirements of the torus have no option but to adopt the compromised 'best-fit' arrangement right down to the non-commutative and interpenetrating cross-over sequencing of the components as represented in FIGS. 2, 3 and 5.

If however, all the components were able to close-pack perfectly throughout a uniformly hyperbolic space then all electromagnetic elements such as electrons and positrons would eventually annihilate or cancel each other out neatly such that all matter and energy in the vacuum would disappear and electromagnetic activity in the space would collapse. Energy and matter is, in effect, 'the grist in the mill' of the churning over or cold-cycling of energetic systems attempting to run down but never reaching the completely balanced spatial nadir of self annihilation because there is topological and geometric mismatch of electromagnetic components in three dimensional free-space in the context of time.

Thus far this patent application has mainly described electromagnetic elements in terms of physical components such as conductors which may have any given or arbitrary thickness and composition. Since it is an aim of this document to include within its scope a description of a blueprint system which relates consistently to the rules and laws of electromagnetism at any scale it is necessary to describe the same concepts at an elementary particle level and demonstrate how the blueprint remains consistent in terms of quantum mechanics and relativity so that it thereby also sheds some useful light on 'wave-particle duality'.

Although it is not an intention of this document to be bound by conventions, most of the above descriptions and nomenclatures used in this document fit in quite well with many aspects of the scientifically accepted electromagnetic qualities and behaviour described by particle physics and cosmology. For example, electrons are known to be an all pervasive elementary particle which is a constituent of all atoms, and they are described as carrying electric current in conductors, and electromagnetic waves are known to be able to propagate without a medium (as in a vacuum in space-time). Also, electron qualities are clearly analogous to the right handed clockwise and left handed anti-clockwise symmetries as described with reference to FIGS. 2 and 3. For example, electrons are considered to be negatively charged and are said to have a spin symmetry and a quantum number 1/2 and paired electron movement is typical (as in paired nodes/domains, each incomplete within itself but each half also half-belonging to adjacent neighbours, locking structures bonded together 'structurally' forming the illusive glue, or basic cohesive forces of nature, but with paired components being held apart by forces of compression or notionally repelling one another, cf. Cooper pairs. Furthermore, in VSEP theory electrons are said to move as far apart as possible to account for the mutual repulsion between like charges (as in the case of parallel twin conducting pairs described above). Some of these issues will now be described in more detail below.

Electromagnetism is the physics of the electromagnetic field which exerts a force on particles that possess the property of electric charge, which in turn is affected by the motion of those particles within the three dimensional field. The magnetic field is often produced by the motion of electric charges, resulting in an electrical current. However, electric charge does not necessarily imply a relative motion of physical parts, such as an electrical coil being moved relatively to a magnet, as in a generator for example, and in the case of, say a photovoltaic cell, electric charge is set in motion without any external mechanical force being applied. Similarly it is known that an electromagnetic flux field may emit some energy which can be inducted or harvested without any moving parts.

For the purpose of description it will be assumed that electromagnetic elements or components may exist equally in any material or space-time including an electromagnetic field such as the dark energy and dark matter in space. All electromagnetic entities are geometrically required to attempt to achieve a ground-state equilibrium by close-packing in tension, however under normal geometrical and topological conditions electromagnetic entities can only achieve a dynamic cold cycling equilibrium, as stated above. The apparently different electrical and magnetic components are features of the same electromagnetic entity seen in different axes. Maxwell's equations for electromagnetic waves state that the electric and magnetic field oscillate with the same frequency and in the case of a plane electromagnetic wave both fields oscillate with both fields perpendicular to the direction of propagation and perpendicular to each other. Such waves are known to be able to propagate through space without an apparent medium and/or in a vacuum. This patent application describes how these electromagnetic fields and elements are spatially and topologically bound together and held apart in a continuous interwoven electromagnetic matrix and circuits defining highly specific functional geometrical arrangements which may be usefully applied to electromagnetic devices and appliances.

For clarity, the term 'free-space' is described in this document in terms of a simple notional Euclidean geometrical three dimensional empty volume without any preferred axis or polarity or inherent forces of tension or compression, or energy or connection with the so called fourth dimension, time. However, in reality 'free-space' is never absolutely devoid of electromagnetic activity which may pass through it. The terms used in this document relating to the geometry of space incorporating such electromagnetic activities, qualities, fields or entities is referred to as 'space-time' (four dimensional) to distinguish it from the simple three dimensional geometrical definition of empty space—'free-space'.

It is also to be noted that, according to current generally accepted relativistic theory, 'space-time' is considered to actually become warped progressively towards and in the proximity of any masses, resulting in gravity. However, a tenet of this document states that while electromagnetic and other fundamental forces within 'space-time' do interact in proximity (according to inverse constraints) within 'free-space' it would be a misconception to describe this as 'warped space'. The three dimensional activity of fundamental forces within 'free-space' may optionally be described as warping 'space-time' but this only ever takes place within the fixed three dimensional arena of 'free-space' which in itself is a constant immutable objective reality which does not become distorted or warped by any activities which may be taking place within it.

It is to be noted that generally accepted physics at this time describes a vacuum as a volume of 'space-time' that apparently contains no particles of any sort (ie. like 'free-space'), however it is also known that all 'space-time' incorporates a very important energetic potential which may spontaneously manifest itself into matter and return to energy at any time and as instabilities or turbulences within the spatial field may arise. Indeed, current cosmology and science describes 'space-time' as incorporating background radiation, and undetectable dark energy and dark matter which cosmologists calculate accounts for approximately 96% of the invisible or inferred mass of space-time. It is generally considered that these dark entities provide the gravitational cohesive forces required to hold parts of the galaxies together (as gravity) and yet provide the equally illusive repulsive forces in the cosmos to cause it to accelerate in expansion such that it does not collapse back. Clearly gravity and the forces of acceleration on related masses are equivalent and are governed not by the warping of space per se but by the allowable geometrical and topological physical activities permitted within the constraints of 'space-time' functioning within 'free-space'.

This document shows that the electromagnetic components are functionally required by the geometry of space-time to mutually attract and close-pack within free-space and are therefore structurally in tension within free-space. Electromagnetic space-time is demonstrably geometrically hyperbolic functionally and is normally in tension wherever possible but it is unable to close-pack into a ground-state equilibrium in 'free-space' because of the internal and external geometric constraints including those imposed by the surrounding or ambient electromagnetic activity in 'space-time'. There is therefore a fixed geometric relationship between 'space-time' (normally in tension) and free-space (neutral, no tension or compression) and this directly leads to an ambient level of instability manifested as electromagnetic energy and activity such as the back ground radiation detected in space-time. Back ground radiation is generally misinterpreted as being the residual echo of a theoretical and unproven 'big bang' which is supposed to represent the beginning of all time and space some 13.5 billions years ago. Indeed, it is thought by some imminent physicists, cosmologists and mathematicians that the big bang even defined the laws of physics before which space and time themselves did not exist or physics may have been controlled other laws. These are clearly an irrational and unscientific concepts as they can not explain what could have triggered the beginning space and what may have existed in its place and why the big bang occurred at a time when time itself did not exist by its own definition.

Moreover, the most commonly accepted possible solutions by the maths and science establishment, such as string and super symmetry theories, requires that there be many more than four dimensions of space and possibly millions of other galaxies coexisting with the empirically observable cosmos we know. These extra dimensions are plainly not only empirically invisible or intangible but they are unacceptable and unnecessary to prove the fundamental forces which drive space-time in the context of its logical and empirically understandable geometry and topology.

Now it will be shown how the geometry and topology describes the structure of space-time within free-space and how this governs the very existence of the fundamental forces, some of which may be used in various technologies. These concepts are described with reference to the figures and text in this document, and these descriptions may be understood to relate to molecules and electrons and wave structures and the mechanics of any substances constrained by the structure of space. The structures described may therefore be considered as blue-prints or road-maps for useful chemical or crystallographic arrangements.

As previously stated, the FIGS. 2 to 8 represent arrangements in which there may be electrical conductors or similar components describing electrical and magnetic circuits at a macro-scale such that conductors may be read as electrical wires stacked and crossing over each other like commonplace electrical windings. Since the conducting wires occupy space and tend to be cylindrical (and they may even have insulation sheaths along their lengths) there are significant gaps or spaces in between the conductors, especially at the substantially perpendicular intersections as can be seen in these figures.

At a very much reduced nano- or molecular scale the conductor means maybe reduced to contiguous conductive and permeable pathways in which all the gaps and spaces between have been 'squeezed out' such that each intersection, line or point represents a cusp or turning point or node between positive/negative and/or north/south in a three dimensional wave matrix or lattice structure.

Figure 10:
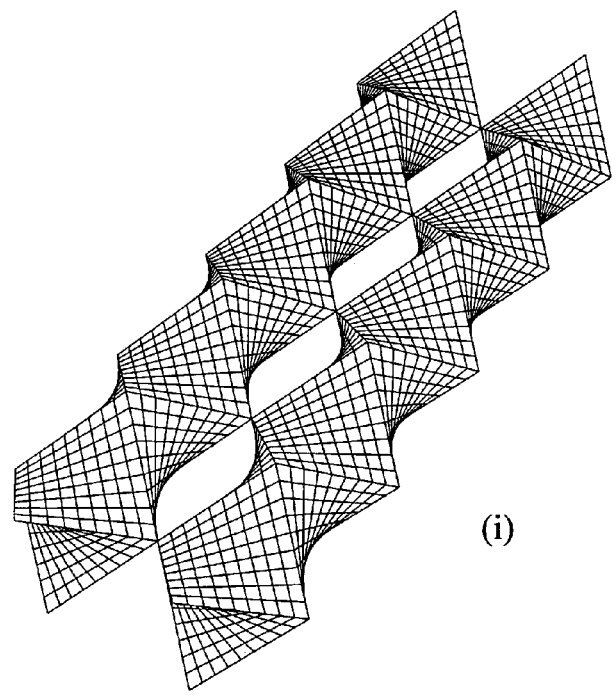
FIG. 10(*i*) is a perspective representation of two parallel conductors as if removed from a lattice of close packed perpendicular conductors.
Figure 10:
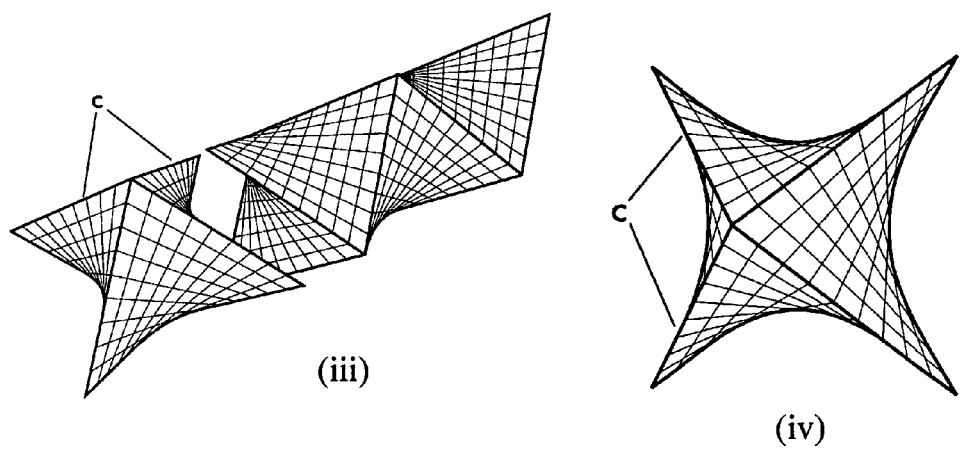
Figure 10:
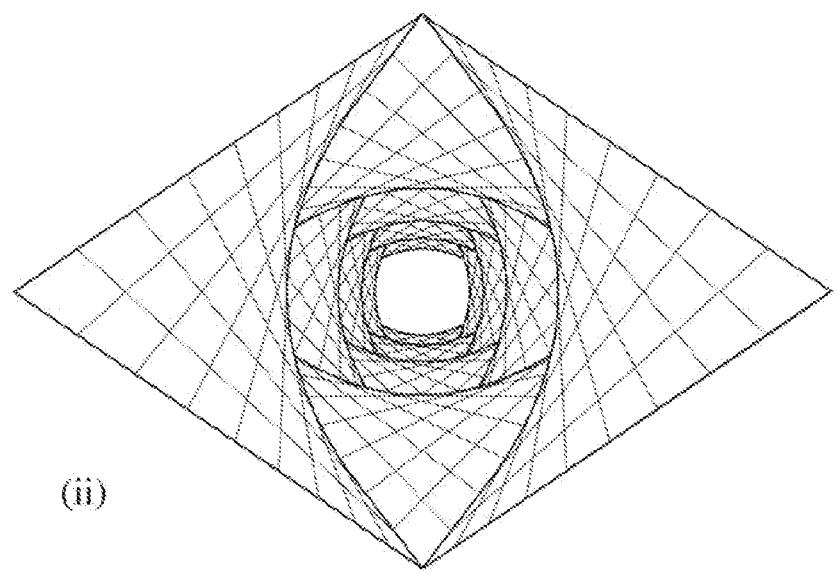

FIG. 10(*i*) is a perspective representation of two parallel conductors equivalent to those illustrated in FIG. 1. However in FIG. 10(*i*) these are seen as if they had been dissected out of a solid matrix or compressed lattice in which any gaps in between the perpendicular conducting path ways had been removed.

FIG. 10(*ii*) represents a view inside and along through centre of one such conducting path way.

FIG. 10(*iii*) demonstrates that each conducting pathway comprises of discreet units which are each rotated through 90 degrees relative to the identically structured contiguous units. These structures may represent part of a three dimensional wave structure such as various types of transverse or plane waves which may exhibit perpendicular electro- and magnetic wave forms, both being perpendicular with respect to the direction of propagation. Further details of the wave structures will be described later concerning wave structure.

Figure 12:
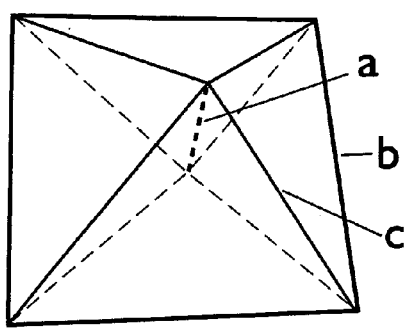
FIGS. 12 (*i*) and (*ii*), and FIGS. 9(*iii*) and (*iv*) represent an irregular octahedron being an arrangement of four tetrahedra.
Figure 12:
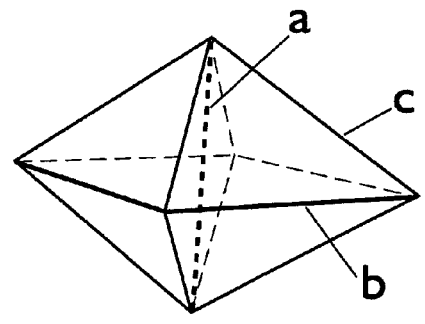
Figure 12:
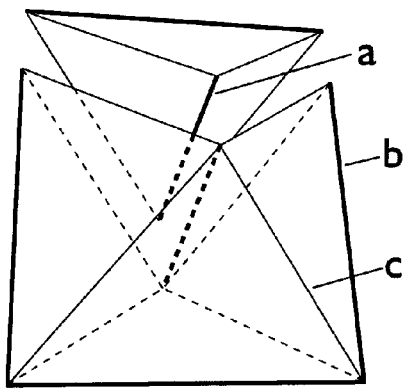
Figure 12:
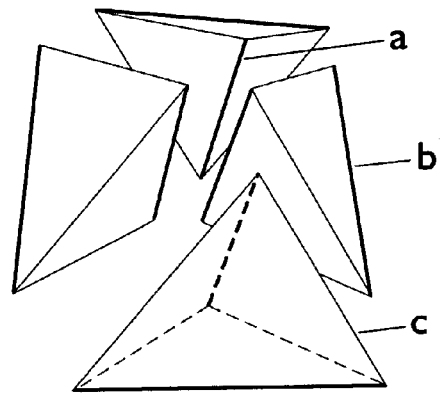
Figure 12:
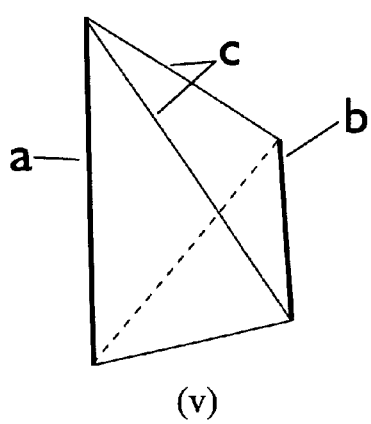
Figure 12:
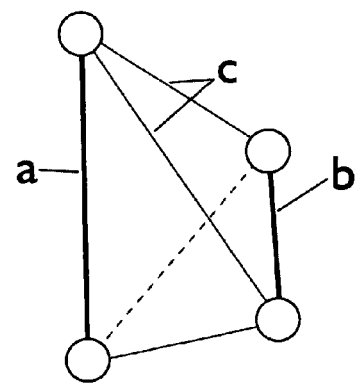
Figure 12:
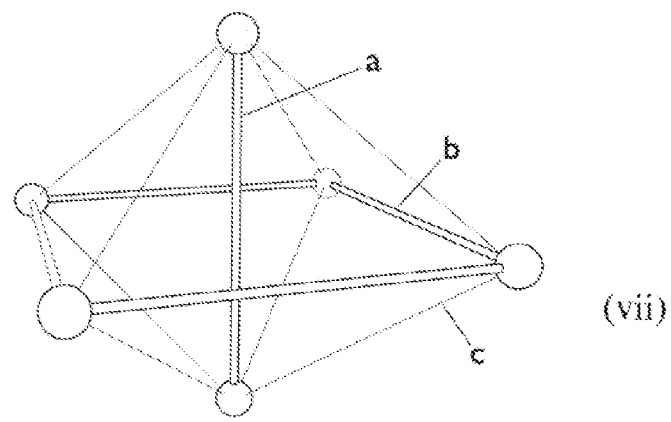
Figure 12:
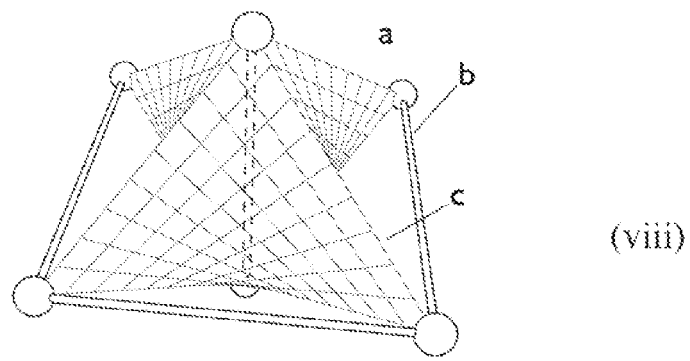
Figure 12:
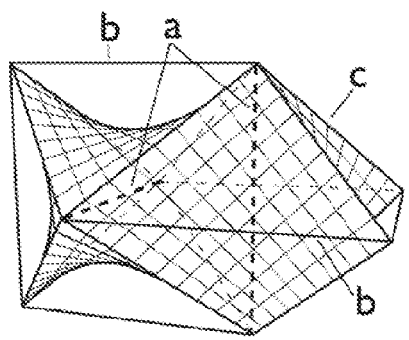
Figure 12:
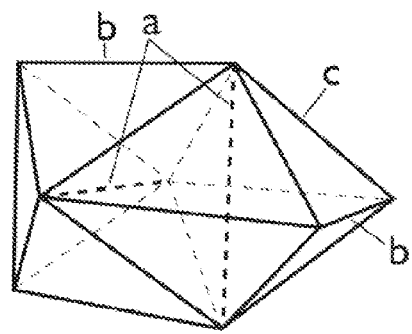

The discreet unit (eg. FIGS. 10(*iii*), (*iv*), (*v*), (*vi*)) can be seen to be defined by six spatial points equivalent to those of an octahedron as is illustrated in FIGS. 12(*vii*) and 12 (*viii*), but unlike an octahedron which by definition has eight facets the structure in FIGS. 10(*iv*), 9(*v*), (*vi*) and 12 (*viii*) is bounded only by four curved faces, each face being a very specifically dimensioned hyperbolic paraboloid.

Since there is no known name for this discreet unit structure represented in FIG. 10 this structure will be called a 'hyperhedron' henceforth in this document for the purpose of clarity and simplicity. For further clarity the hyperbolic sides of the hyperhedrons have been drawn showing the straight line generators in the Figures such as 10(*iv*), (*v*), (*vi*) in order to help visually define the curvature of the four sides in the drawings.

Each of the four hyperbolically curved facets bounding each hyperhedron represent the minimal surface areas between the edge boundaries. Accordingly when the hyperhedron is viewed end-on in plan view as shown in FIG. 10(*vi*) the central saddle part of the curvature represents a distance midway between a line drawn between the points and the main axis. It should be understood that the discreet hyperhedral unit as represented in FIGS. 10(*v*), (*vi*) have specific spin symmetries such that if, for example, the hyperstar represented in FIG. 10(*vi*) is described as having a counter clockwise spin direction then when the same hyperhedron is viewed from the other end it would not be seen as being in mirror image and therefore having a clockwise spin but it would be seen to have the same counter clockwise spin.

FIG. 10(*v*) represents a counter-clockwise spin symmetry while 10(*vi*) therefore represents a hyperhedron having clockwise spin symmetry. Moreover if the straight line generators illustrated on the hyperhedrons are assigned a directional values (such as +/− or N/S along the lengths of the straight line generators) then left and right (clockwise or counter clockwise hyperhedrons may be considered to represent a structure which carries sufficient specific three dimensional information to define an electromagnetic structure such as point particle or electromagnetic charge having a main central axis and a surrounding toroidal field demonstrating a specific polarity and electrical charge or status. The hyperhedral structures therefore are functionally and geometrically similar to the more complex arrangements described with reference to FIG. 2 through to FIG. 8.

The relevance of this is further described with reference to other arrangements where groups of hyperhedra are close-packed so that they are required to interact with adjacent hyperhedral units and also co-exist collectively in an open or closed ambient field as will be described in further detail with reference to FIGS. 11 and 14 for example.

Figure 14:
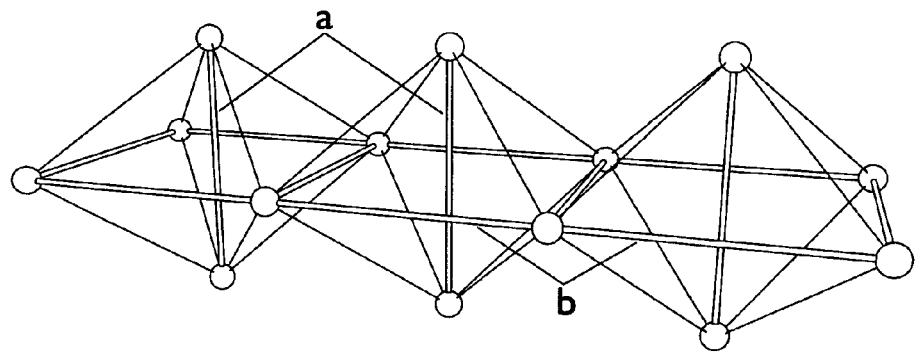
FIG. 14(*i*) is a perspective representation showing three octahedra contiguously arranged within a frame lattice including corner particles.
Figure 14:
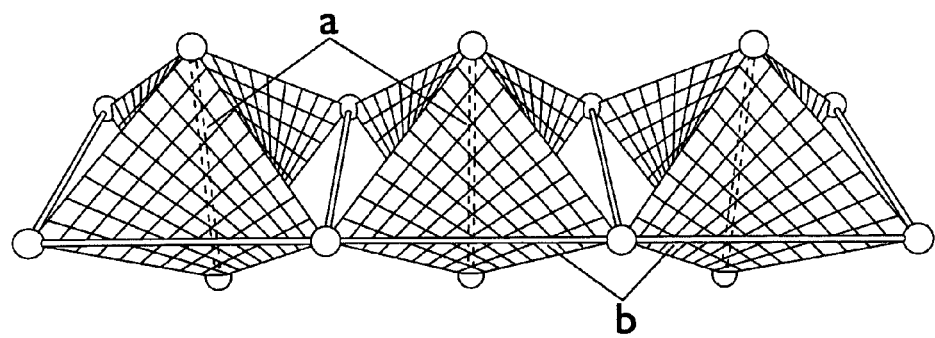
Figure 14:
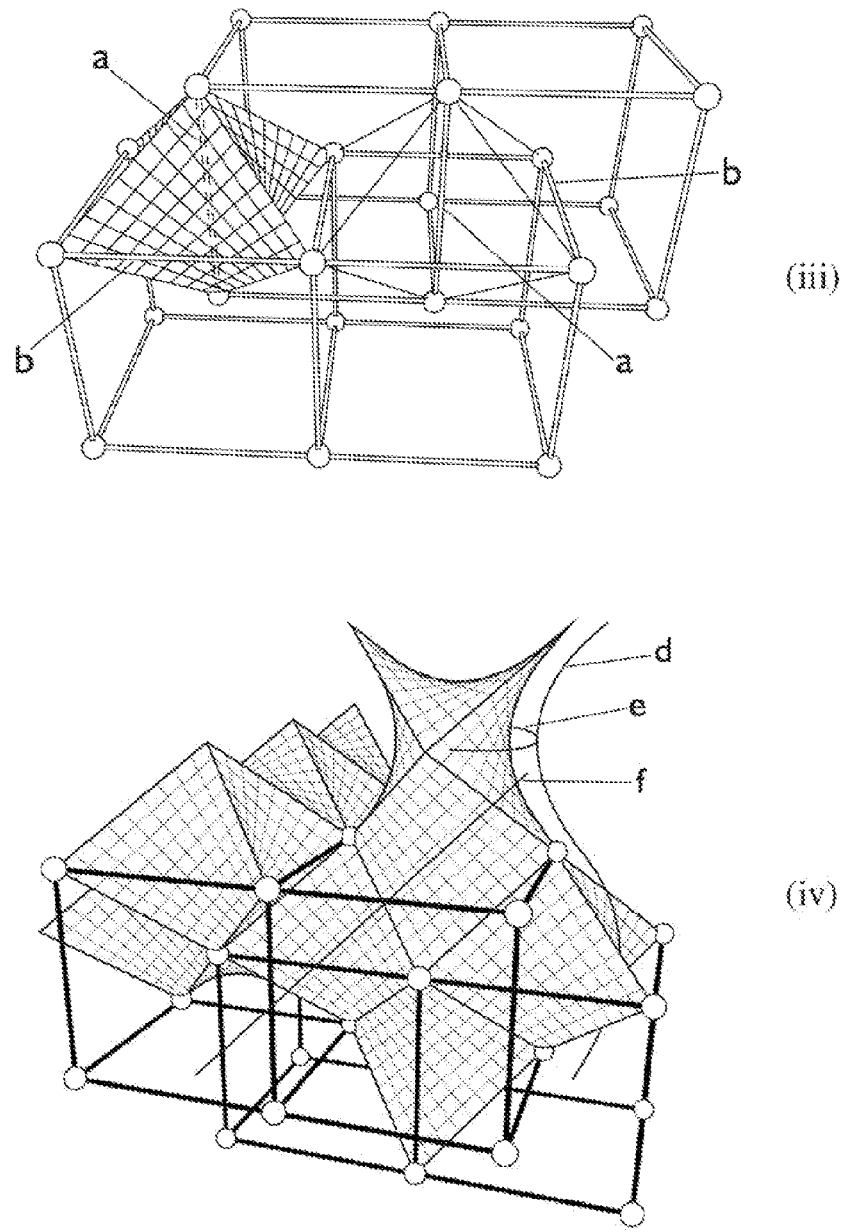

FIG. 14(*i*) represents a chain of three contiguous octahedral units and FIG. 14(*ii*) represents a similar development of three hyperhedral units being the three alternate hyperhedral units similar to those structures shown in the preceding figures such as FIG. 10 (*i*), 10(*ii*), 11(*i*).

While a chain of hyperhedral units can be assembled to make chains or pathways comprised of discreet units (FIGS. 10(*iii*),12(*ix*) the octahedron units are forced to overlap or merge and thereby share the space occupied by a common tetrahedron in-between, as represented in FIG. 12(*x*). Note that there is a tetrahedron common to both the merged perpendicular octahedrons in this figure.

When two hyperhedrons as represented in FIG. 12(*x*) are located immediately adjacently together such that their main central axes (marked 'a' in all the Figures) occupy the same positions the hyperhedrons remain as discreet units because the curved hyperbolic surfaces provide an identical perpendicular interface surface between the two hyperhedrons which thereby do not compromise the spaces around the main central axis. This interface can be read as the shear plane or cusp of electromagnetic activity occurring between two perpendicular and adjacent main axes.

It will be seen in all of the Figures that the main central axes of the octahedra or hyperhedra represented in full are marked 'a' and the main axes of adjacent or incomplete perpendicular octahedra or hyperhedra (which are not shown) are marked 'b'.

Accordingly, FIGS. 12(*i*), (*ii*) represent perspective views of a specifically proportioned octahedron in which the main central axis is marked 'a' and the four perpendicular axes which also belong to adjacent octahedra (not shown) are marked 'b'. The diagonal lines between the ends of the main common axes and the ends of the adjacent perpendicular main common axes are marked 'c'.

FIGS. 12(iii), (iv) illustrate how each octahedron comprises of four specifically proportioned tetrahedra all of which share the same common central axis 'a' and perpendicular to this each tetrahedron has a discreet second axis of the same length as 'a' but marked 'b' in accordance with FIGS. 12(i),(ii).

FIG. 12(v) represents one such tetrahedron as if dissected out of the octahedron represented in FIGS. 12(i),(ii). FIG. 12 (vi) represents the same tetrahedron but bounded by four spherical nodal points as in FIG. 12(x) for example. These spherical nodal points may be read as representing the positions of elementary or fundamental particles.

The specifically proportioned tetrahedral unit (in FIGS. 12(v)(vi) for example), is therefore one of the most fundamental arrangements and will be described in more detail with reference to FIG. 12.

This tetrahedral unit may be called an irregular tetrahedron in that the four facets are not bounded by regular equilateral triangles with edges of three equal lengths. The tetrahedrons represented in FIG. 12 each comprise of highly specific dimensions and ratios in order that the full three dimensional lattice may fit and close pack together. Accordingly the two diametrically opposite and perpendicular edges marked 'a' and 'b' in FIGS. 12(v),(vi) are the same length but of these both are longer than the other two pairs of opposite edges marked 'c', the ratio of the longer two edges with respect to each of the other four shorter edges being approximately 10:8.6 respectively, while the included angles of the four isosceles triangular faces of the tetrahedrons being one of 70.5 degrees and two of 54.7 degrees approximately.

Such specifically proportioned tetrahedral arrangements therefore define the component parts of the larger octahedral arrangements which in turn collectively are perpendicularly arranged but these are then caused to have flat faced boundaries which are compromised in order to form a workable close packed three dimensional matrix or lattice. The tedrahedral and hyperhedral units may therefore be described as two of the most basic structural arrangements in nature in which for example the corners of the tetrahedral units may represent two mutually repelling electron pairs within a three dimensional field lattice of elementary particles. In 'Valence-Shell Electron-Pair repulsion theory' (known as VSEP theory) some molecular arrangements such as the methane molecule is said to have four bond pairs and no lone pairs so its arrangement may appear to be tetrahedral. The water molecule also has four pairs, two bond pairs and two lone pairs and its shape is therefore based the tetrahedral distribution of the electron pairs.

White phosphorus, caesium chloride, and holmium, amongst many others demonstrate structures which exhibit molecular arrangements based on the slightly irregular tetrahedral and octahedral geometry described in this document. Some of the best conductors and most interesting electromagnetic materials such as copper, aluminium, silver and gold that adopt the face-centred cubic arrangement may also therefore be satisfactorily analysed in terms of the hyperhedral matrix being described in this document.

Many structures can be defined as octahedral or hyperhedral and therefore may have sub sets of tetrahedral arrangements such that the octahedral structures are commonly described as having three electron pairs carrying 'like' charges and therefore repelling each other mutually in the most energy acceptable arrangement; all the pairs being located in planes which are mutually at right angles to one another.

When electron pairs or any pair of particles or entities are said to repel one another it can be interpreted that there is a force of compression between the two, and similarly when entities are said to be mutually attracted it can be interpreted that there is a force of tension between the particles. By analysing the positions and forces between entities in a three dimensional context in terms of forces of compression or tension the realistic geometry of space can be realised in terms of any permissible physical or electro-mechanical activities and relationships of any elements governed by the constraints of free-space.

The eight facets of the octahedron (FIG. 12(i),(ii) are merely the conventional way of defining and classifying the geometry of the structure but the eight facets or sides are of no real consequence in themselves. If each tetrahedral arrangement as shown in FIG. 12 (vi) may be considered to have a central atom then the common definition of a regular tetrahedron would indicate that the central position of the atom can be defined by the four identical included angles at the atom and between the four outer points, being 109 degrees approximately. However, in the case of the irregular tetrahedron as represented in FIG. 12(v) in which the two opposite sides are longer than the other four and the angle at the central position or atom would be approximately two of 126.8 degrees and two of 104.5 degrees.

When four such tetrahedra are fused as described with reference to the octahedral or hyperhedral structures as in FIGS. 12 (i),(ii),12(viii) a single central atom may also be defined in the centre of the main axis 'a' (not shown).

In FIGS. 12(vii), (viii) the main axis of the octahedron or hyperhedron is marked 'a' and may represent the magnetic polarity or the electrical component and conversely the minor axes marked 'b' surrounding the main axis 'a' may represent the direction of the perpendicular field surrounding the main axis of a fundamental electromagnetic element such as an electrical charge. The conceptually circular field surrounding the 'a' axis of a lone charge has therefore become distorted into a best-fit square configuration marked 'w-x, x-y, y-z, z-w' when under the influence of the four perpendicular hyperhedrons such that, for example, the magnetic 'a' axis of one hyperhedron's axis represents the 'b' electrical component of the neighbouring hyperhedral arrangement and visa versa so that the adjacent perpendicular hyperhedral arrangements are interdependent, mutually defining and functionally inversely linked in a strict geometrical relationship which is scaleable and directly testable and borne out by the accepted laws of electromagnetism.

It can therefore be seen that the field around the main axis is now defined as four points marked 'w,x,y,z' which may be all considered to be mutually attractive relative to each other in one plane and yet held apart by a force of compression, in the radial plane around the main axis 'a'. This situation and geometrical arrangement is reinforced when the perpendicular electro-magnetic components of adjacent hyperhedral structures are functionally mutually supportive in the correctly defined three dimensional field. It should be noted that in most arrangements the structure works equally well when the forces of tension and compression are reversed.

Conventionally VSEP and similar theories state that pairs of elementary particles repel or attract in trigonal, tetrahedral, trigonal bipyramedal or octahedral arrangements with little reference to the functional influences of the ambient field.

The hyperhedral model is therefore an accurate way to define the forces of compression and tension between the elementary particles in a geometrical lattice and it therefore provides a better method to design specific compounds for specific purposes. The hyperhedral electromagnetic spatial definition system may, for example, be used to analyse the binary compounds in various crystallographic structures, such as rock-salt (halite) or even any so called perfect crystal type of structure.

In binary compounds such as sodium chloride NaCl structure is often conventionally said to have each ion located in a face-centred cubic array, such that the structure can be described as two interpenetrating face-centred cubic arrays which is exactly equivalent to the hyperhedral structures represented in FIG. 14. Caesium chloride consists of two interpenetrating primitive cubic arrays and the sodium ions are said to occupy octahedral holes in the face-centred array of chloride ions. These geometrical arrangements can be exactly interpreted in terms of the hyperhedral model outlined in this document. The hyperhedral model however has the advantage because it re-interprets the abstract concepts in terms of solid physical and mechanical processes and pathways in three dimensional space such that the elements can be analysed and manipulated to perform specific functions according to their understandable functional relationships.

In FIGS. 10(*i*), 11(*i*) it will be seen that the negative spaces in between the two hyperhedral line-ups can exactly accommodate other line-ups, but in the other two perpendicular axes. Furthermore, many other line-ups maybe added above and below in the third perpendicular plane such that a dense cluster of line-ups result in a matrix without any gaps or spaces there between. It will be seen (FIG. 10(*vi*)) that the perpendicular convex and concave planes of each adjacent contiguous hyperhedron meshes precisely with the concave and convex planes of the neighbouring hyperhedrons located at 90 degrees and all the hyperhedrons therefore fit exactly together forming a dense solid matrix without any gaps. The convex and concave interface planes are therefore equivalent to the twisted flux paths represented in FIGS. 2(*i*), 3(*ii*) such that the element or node at the innermost junction nodal point between each set of six conducting means may define the position of the elementary particle.

Figure 11:
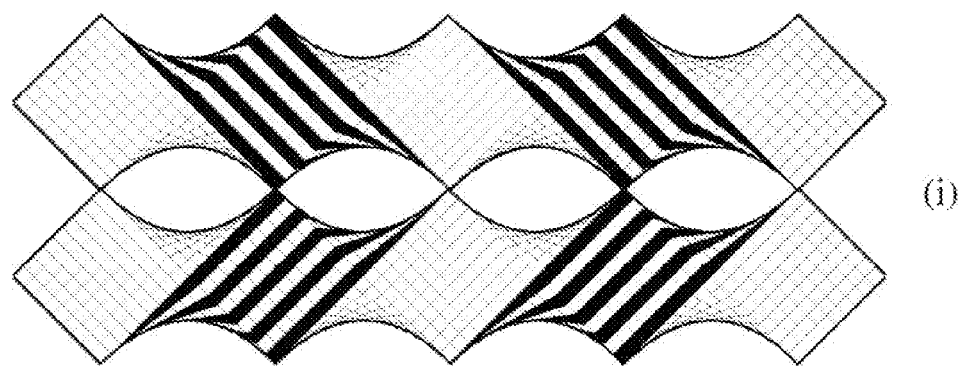
FIG. 11(*i*) is a plan perspective view representing two parallel conductors formed out of two lines of hyperhedra demonstrating two different helical symmetries.
Figure 10:
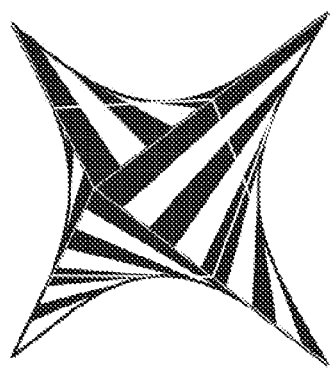
Figure 10:
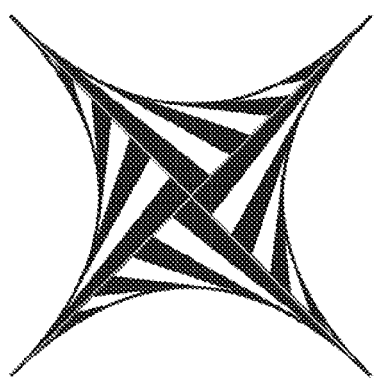
Figure 10:
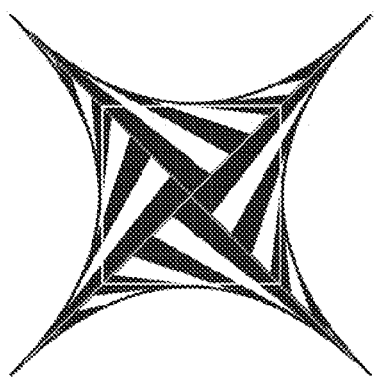
Figure 11:
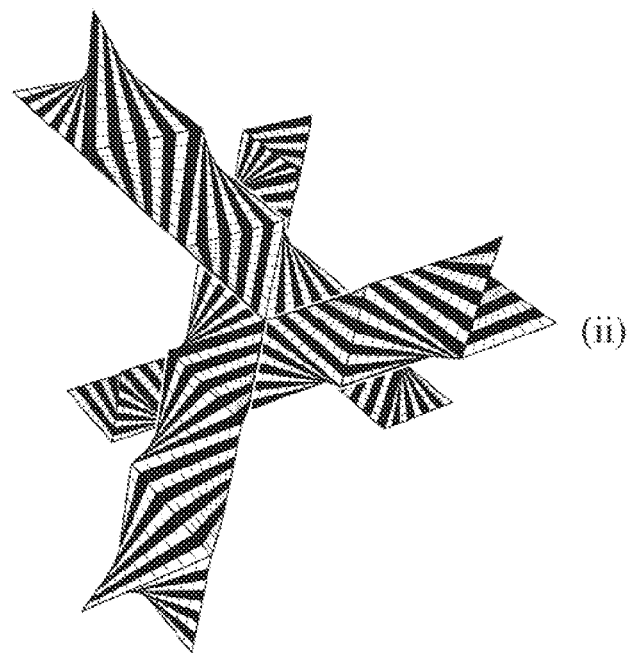
Figure 11:
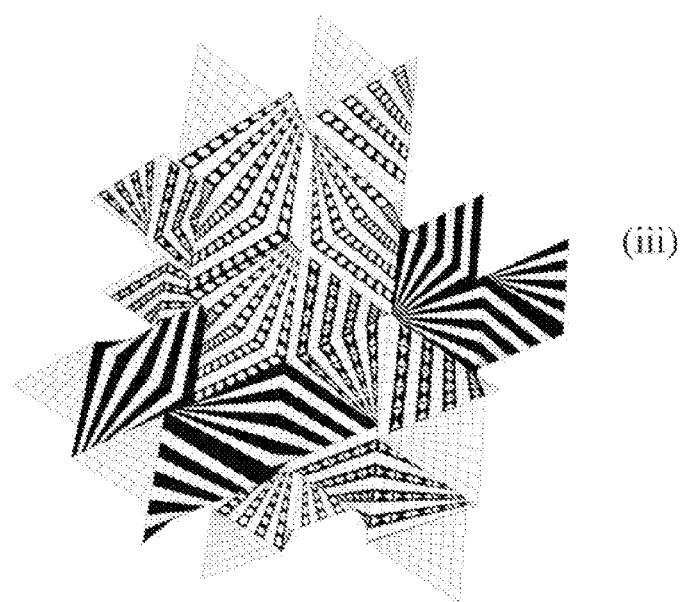

When three perpendicular line-ups of hyperhedrons are isolated out from the matrix they may appear as shown in FIG. 11(*ii*). As this Figure may be slightly confusing to read it is drawn with a pattern similar to that seen in FIG. 10(*v*). FIG. 11(*ii*) and therefore represent a right handed/clockwise node junction which is exactly equivalent to the three electromagnetic means such as the conductor nodes represented in FIGS. 2(*i*),(*ii*).

FIG. 11(*iii*) represents six line-ups in the form of two stacked nodes, the right handed or clockwise node being stacked vertically on top of the left handed or anti-clockwise one below. This Figure is then exactly equivalent to the six conductor type means shown in FIG. 5(*i*) and it is functionally equivalent in electromagnetic terms such that the relevance of perpendicular functional relationships with reference to symmetry and the right and left rules still all apply.

Also, in relation to FIGS. 3 and 5 it has already been stated that there is a non-commutative step up/down in between conductors in a nodal arrangement and that this causes a functional 90 degree twist in the field and conductor at the points of contact in the nodes and this is represented by lines drawn on the cylindrical parts representing the conductors in these Figures. The interface between two contiguous hyperhedrons (such as those represented in FIG. 11) has already been described as hyperbolic and as such that it may be defined as being composed of a series of two perpendicular sets of parallel straight line generators. Functionally therefore, the 90 degree non commutative step up/down and 90 degree twist in between the conductors described with reference to FIGS. 3 and 5 is the same as the functional 90 degree twist which occurs in between the straight line generators convex/concave planes located perpendicularly in FIG. 11. The right angled twist is a requirement in both situations in order to maintain electromagnetic continuity within the length of the conductor means or line-ups (cf. Maxwell's equations) as well as remain correctly orientated with reference to surrounding perpendicular members in a normal three dimensional Euclidean space.

The 90 degree twist or step-up/down occurs at various other levels of electromagnetism such that it always functions in a generic way and defines a twist as is evidenced for example by the Faraday effect or Faraday rotation which is a magneto-optical interaction between light and a magnetic field. The rotation of the plane of polarisation is proportional to the intensity of the component of the magnetic field in the direction of the beam of light.

The functionality of most electromagnetic activity may be described with reference to a close mechanical analogy illustrated in FIGS. 13(*i*)(*ii*) which represent double helixes, again not coincidentally unlike DNA and being the basic electromagnetically organised fundamental structure of nature.

Figure 13:
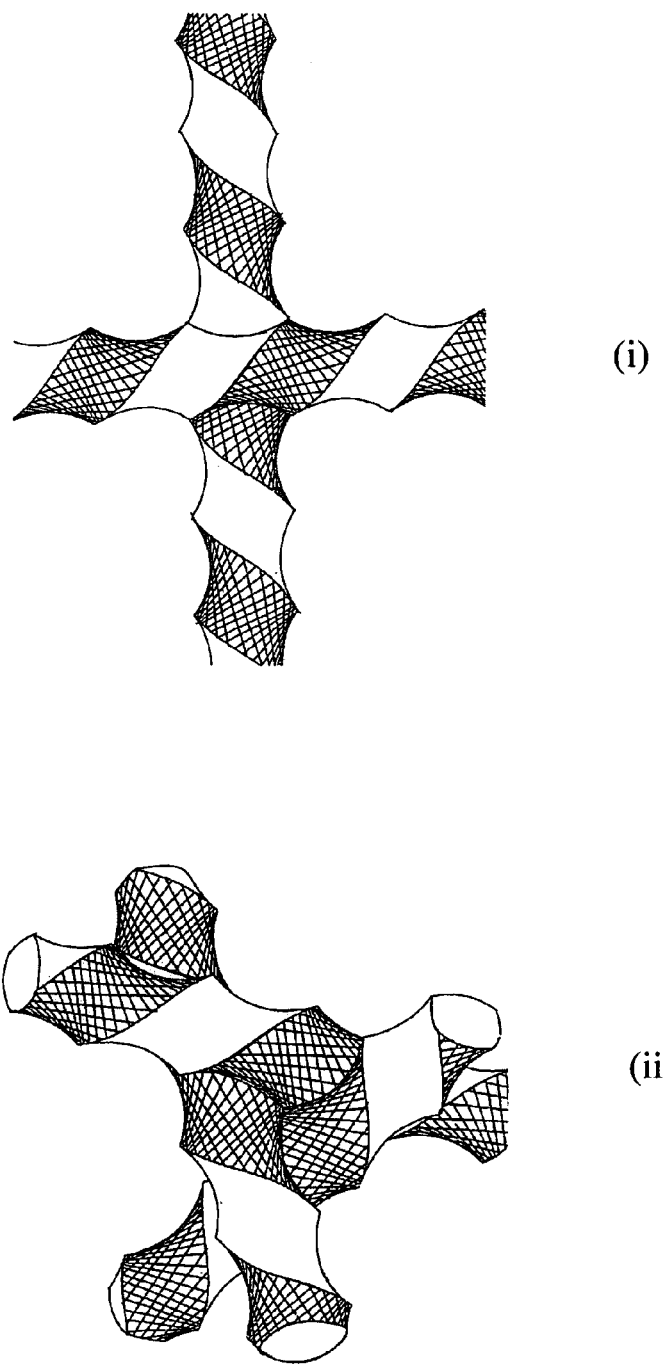
FIG. 13(*i*) is a perspective representation showing two perpendicularly meshing double helical spiral members.

FIG. 13(*i*) represents two double helix spiral structures of the same (say) left handed or anticlockwise geometry. The spirals may be considered to be similar to gear sets with teeth that mesh at an interface surface defined by straight line generators on a spiraling hyperbolic surfaces such that the convex axis of each spiral fits into the concave axis of the contiguous adjacent gear set. It will be understood that if one spiral is rotated about its long axis then this will cause the other spiral to rotate as well, and both gear sets will also wind along each other's length perpendicularly like a worm drive. In many respects FIG. 13(*i*) is therefore a reasonable mechanical analogy of the conductors illustrated FIGS. 1(*iii*), (*iv*), (*v*).

FIG. 13(*ii*) represents a perspective view of three spiral worm gears meshed and this is a meaningful functional and mechanical analogy of the right handed node depicted in FIG. 2(*i*), and it follows that if any one of these spiral gear sets is rotated this will cause the others to rotate as well and to move in the direction of their long axes. Also if the gear sets are pulled or pushed in the plane of the long axes they will be caused to rotate in specific directions by bearing onto neighbouring spirals just as the direction of current flow in a conductor determines the specific flux direction and visa versa.

In the case of the spiral worm gear sets the anti-clastic or hyperbolic faces are defined by straight line generators which are not exactly parallel and at right angles as in the case of hyperhedrons but in most other respects the analogy holds true. If for example the left and right handed nodes were to comprise of gear sets of the same or opposite handedness it can be seen that the gear sets can still mesh quite well and they may also be arranged such that when (say) the left handed gear sets turn anti-clockwise the meshed right handed sets turn clockwise such that they wind away from the central common axis in opposite directions, and like their electrical counterparts the parallel gear sets may be described as 'carrying current or energy' in opposite directions. Furthermore it can be envisaged that if there was an external force such as compression exerted on one of the ends of the gear sets and they were bent around in the correct directions then the mechanical equivalent of a domain structure could occur as represented in the toroidal structure of FIG. 8.

FIG. 14(*i*) represents a chain of three octahedral units aligned in the same plane and touching along the edges marked 'b'.

FIG. 14(*ii*) represents a chain of three hyperhedral units similarly orientated and each touching the adjacent units at the corners of the 'b' axes. It will seen that gaps exist between the hyperhedral units which exactly accommodate further hyperhedral units such that conductive pathways are formed similar to those represented in FIGS. 10(*i*), 11(*i*), 11(*iii*) etc. Further hyperhedrons may therefore be stacked on all four sides of each hyperhedron and as indicated previously in relation to FIG. 11((*ii*),(*iv*) for example. These hyperhedra may form parts of perpendicular conductive pathways in each perpendicular direction such that a solid looking grid or matrix is formed. Each hyperhedral unit may therefore be part of a conductive pathway in two right angle planes and the adjacent hyperhedral units may be part of two other perpendicular conductive (or permeable) pathways located in between and around the first set.

FIG. 14(*iii*) represents two orthogonal or cube grids which comprise of the 'a' and 'b' axes of adjacent hyperhedra. The spherical points drawn on the ends of these axes of this figure may be read as particles. It should be noted that both grids are autonomous in themselves and describe structures similar to centre faced cubic structures defined in crystallohgraphy.

Importantly the two autonomous sets of cubes are only linked via the hyperhedral units diagonal borders (marked 'c' in the figures) such that the arrangement can be considered to describe two distinct sets of particles relatively located in space by way of any forces of tension or compression within the bodies of the hyperhedra or along the surfaces of the hyperbolic faces and/or the diagonal marked 'c' in FIG. 12.

For the purpose of description only, if all the particles marking the ends of each main axis "a" of each hyperhedron are considered to be like-particles and therefore mutually repelling then the main axes could be envisaged as compression members (such as little springs) and the whole structure would expand outwards indefinitely if there was at least one finite edge to the matrix to provide room to expand into.

If the particles belonging to each of the two sets of cubes happened to be dissimilar (or if they were like-particles but were oriented diagonally relatively, as they are) such that in both cases the particles of the two sets of cubes were mutually attractive then the diagonal edges marked 'c' could be interpreted as being tension members (like little elastic bands for example). It is notable that these diagonal tension members 'c' are optimally arranged to structurally triangulate and resolve the forces, including forces of acceleration between the sets of autonomous cubes like chord and web members in an architectural or mechanical space frame.

If the entire structure was finite and surrounded by infinite free-space all around then the structure would either expand or contract until the forces of tension or compression became balanced and an equilibrium ground state was reached. This would, however, presuppose that there was some inherent damping in the connecting compression and tension members. If there was no damping any disturbance in the structure would set up three dimensional waves which would resonate in all directions and probably cause resonant frequencies which could either multiply or diminish the amplitude and frequency of the wave forms. In a perfect undamped situation the three dimensional waves would carry on until damping was introduced or further disturbances set up new wave patterns and sequences.

In the absence of any other known three dimensional wave propagation geometrical system this model may offer a plausible if not tangible explanation for mysteries such as back ground radiation and other related or similar cosmological phenomena. Therefore this arrangement may be considered to form the basis of a blueprint to usefully exploit any natural three dimensional electromagnetic wave activity.

In an alternative situation, some or all of the particles located at the ends of the 'a' axes may be assigned some potential hypothetical masses which may be different or identical, or variable, such that if the matrix experienced some turbulence or forces of acceleration of any kind the disturbance would create an altogether different wave pattern sequence and if there was still no inherent damping within the system the waves would carry on reverberating indefinitely such that different patterns would describe different electromagnetic qualities and materials and this therefore again provides a useful blueprint which may be exploited. The normal course of entropy dictates that no systems are frictionless and some damping would occur reducing the wave patterns to an ambient back ground noise which would be fed by electromagnetism's (never ending and normally failing) quest to entirely close pack towards a single central point.

In the event that a force of acceleration is applied to a matrix such as that which may be designed to act as a piezoelectric material, such a material would normally comprise of two sets of compression members linked by way of tension members diagonally triangulating the forces between the two sets of compression members or vice versa, and any relative movement between the two sets, such as one set experiencing a force of acceleration differently to the other will initiate a flow of electrical energy in proportion to the amount of damping provided by the arrangement. Conversely an electrical energy applied to at least one set of compression members or tension members may be expected to cause a deformation resolved through the wave structure in terms of a force of acceleration.

It has been previously mentioned that the electromagnetic model or blueprint outlined in this document goes some way towards explaining the fundamental cohesive forces in nature. It is one of the goals of science to explain a grand unified theory in which the four so-called fundamental interactions of nature can be unified into a single solution to explain what holds or 'glues' all matter together. The four forces are the strong nuclear force, the weak nuclear force, the electromagnetic force and gravity. Remarkably, as yet, gravity has not been proven because gravity waves and gravitons and Higgs bosun particles transmitting gravity have not been detected at this time.

Gravity is an extremely feeble force compared to the others, and this document may indicate that there is some reason to doubt that it exists at all as a discreet 'vertically downward' force per se, or whether it is a simple misinterpretation of the way the forces of tension in the more or less concentric layers surrounding any masses tighten the circumferences to collectively emulate a down ward force.

Alternatively since the equivalence principle states that the laws of physics are the same in any non rotating, free falling or inertial frame such that there may be no means of distinguishing between gravity or a force of acceleration acting on a body or mass. Indeed, the force of gravity is therefore equivalent to continuously accelerating the same mass at a speed which mimics the body's mass or 'weight' and under some situations it can be considered to require an input of energy to cause such acceleration. Conversely a force of acceleration applied to specially arranged materials can be expected to absorb harvestable energy while these materials are being accelerated in the same way as an input of electrical energy into a piezoelectric material causes a deformation within its crystalline structure and when a mechanical force is applied to such a material some harvestable electrical energy results.

Relativity explains gravity in terms of curvature of space-time and while this may be correct it should be noted that the immutable 'free-space' in a gravitational field is certainly not distorted like the rather elastic space-time. It is curious indeed that physics since the early part of the twentieth century has used the most elastic yard-stick or measurement system of all—the propagation of light as photons and the speed of light, to measure and define the structure of space-time and it is little wonder that physics is in disarray producing such a variety of unprovable alternative theories like string and M theory.

It would be very useful to resolve the issues of the fundamental forces, gravity, curvature of space-time and what creates the quality known as mass. One reason for resolving these issues is that potentially the equivalent of a static force of acceleration may be applied to usefully harvest energy on the basis that it takes (electrical) energy to create a constant force of acceleration (eg. by way of an electric motor) and conversely a constant force of acceleration could potentially be harnessed to run a harvesting system to produce electrical energy as in photovoltaics.

Whichever of the fundamental forces of nature is being considered, their functional arrangements due to the constraints within space-time indicate that space-time would exhibit generic forces of tension and compression which have to interact within that three dimensional free-space and in the context of time. Background energy or noise in 'space-time' is theoretically structurally in tension within the Euclidean 'free-space' vessel, which simply exists as a neutral container. Each element or particle in space-time is however directly involved in the quest to close pack inwards towards a central persuasive mass which thereby gathers more mass.

As all the natural physical forces should obey the same generic principles of physics, it can be surmised that the forces of attraction over equal forces of repulsion should result in a homologous isotropic field and that aggregation of matter should not be the exception rather than the rule. However gravity demonstrates this is not the case even though gravity per-se may not exist at all but may simply be a manifestation of fact that it is easier for all (polarise-able) types of matter or 'particles' to turn or re-orientate and gravitate towards the nearest central and finite common conclusion. It is evident that it is more difficult for the same matter or particles to mutually repel each other away from each other and possibly towards other adverse situations of attraction by dissimilar poles.

The predisposition of forces of attraction to dominate over forces of repulsion can be experimentally demonstrated by a two-dimensional analogy imagined by spreading lots of spherical magnets (with a polarised axis) evenly on a smooth flat surface and then releasing them. While the 'like' poles repel as strongly as the 'unlike' poles attract it will be seen that the magnets immediately turn around so that each north pole faces a south pole face and then they immediately gravitate into a clump demonstrating that the inward force of tension in a field is focused concentrically and is more persuasive than the equal forces of compression/repulsion away from a central point. If the experiment was to be duplicated three dimensionally in a zero gravity context without any outside intervention a toroidal form would result as the best fit low energy arrangement as described with reference to FIG. 9. Then the more detailed electromagnetic mechanics of the toroidal form is described with reference to the FIGS. 1-9.

The relevance of this is that in designing workable electromagnetic energy gathering technologies it is often important to provide equipment which is sensitive to an electrical potential gradient ranging from an outer area of compression towards an area of attraction where close packing of elements is continuously encouraged in a central vortex core area and such that the sign or polarity may appear to become switched relatively by way of a specific geometrical arrangement including a topological trick. This then provides the system with the opportunity to undergo an expansion or repulsive phase, which naturally decays (as described above) when the components reorientate to become mutually attractive again and thereby restart the process. The difference between the system's need to contract and expand provides some harvestable energy potential and the extraction of some such energy results in a damping force such that if too much energy is gleaned off the process may be halted or destroyed. It is interesting to compare this with the attempt to harvest energy from the nuclear fusion process being conducted in the Tokomak torus at the JET facility in southern France.

At this point it becomes necessary to describe in further detail how and why three dimensional electromagnetic wave structures exist and become propagated in arrangements the such as those represented in FIGS. 11($iii$), 14($iii$)($iv$) and 15($i$),($ii$).

Figure 15:
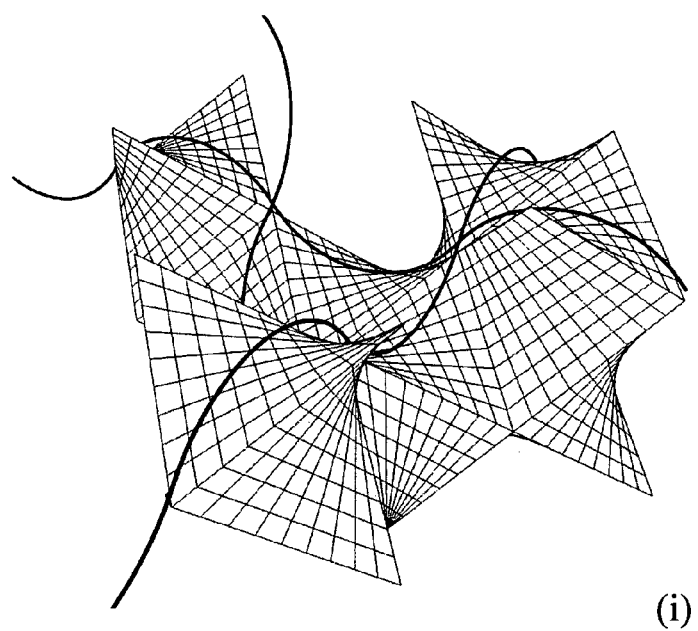
FIG. 15(*i*) is another perspective view of the surface of adjacently located hyperhedra indicating the types of parabolic wave forms associated in and around each hyperhedra in all three axes of space.
Figure 15:
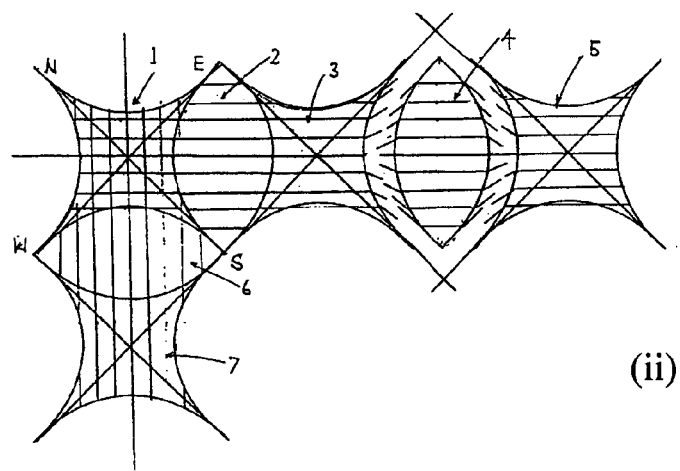

FIG. 15 represents a cross sectional view through a series of five hyperhedra in one direction and three in a right angle arrangement. For the purpose of explanation it can be imagined that a line-up of hyperhedra (as represented in FIGS. 10, 11) is made of optically clear glass such that each hyperhedron bends or refracts light passing through it like a lens. Light (in the form of say photons) could therefore be projected through the precise centre line of the line-up such that the photons would encounter a series of transparent interface walls 'head-on' (at 90 degrees with reference to the direction of motion). In this situation the light would not be deflected from a straight-line trajectory.

The parallel lines in FIG. 15($ii$) merely represent the possible paths of a series of 'photons' such that it can be seen that they would not be refracted away from their straight line trajectories while travelling through the central portion of the line-up of lenses. The two hyperhedra on the right side of the line-up marked 4,5 have been slightly separated away from the line up to demonstrate the refraction process as though the hyperheda were in fact lenses. It will be understood from this drawing that each face of each hyperhedron is therefore both convex in one plane (like an optically convergent lens) and concave in the other perpendicular axis (and it therefore acts like a divergent lens in this plane) and as such the focus point has been flattened into a line, but both focus lines occur on the same side of the surface and the light would therefore be twisted through right angles and this is consistent with polarisation. If the 'photons' were projected through a line-up so as to deviate from the central axis and not pass through the central area of the saddle shaped walls they would bounce or be refracted obliquely like light travelling through a lens or prism up towards the sharp edges where the 'information' would become inverted through a cusp focus-point line as it carries on through the edges of contiguous hyperhedra.

If one was unable to view the workings of the internal parts of the hyperhedra or the nodes defining the ends and cross over lines (in the same way as we are unable to 'see' into elementary particles directly) and if one could only observe and measure the external activity then a three dimensional wave structure would emerge as represented in FIG. 15($i$). The wavy lines in this figure follow just some of the typical parabolic path lines across contiguously adjacent hyperhedra such that they make up typical electromagnetic wave motions in all three axes of free-space. Other typical lines denoting the wave forms are also marked on FIG. 14(iv) which shows lines marked 'd' and 'e' intersecting at right angles near the general central area of the saddle shaped interface of the exposed hyperhedron.

Also in FIG. 14(iv) the line marked 'f' indicates one of the straight-line generators which is common to adjacent hyperhedra units referred to in the accompanying text.

As previously explained each hyperhedron comprises of four hyperbolic paraboloids arranged around a central axis. The surface of the hyperbolic surfaces may equally be defined as a series of straight-line generators as can be seen in FIGS. 10(v),(vi), 11(i) and 15(i). It should be noted that the lines around the edges and through both the perpendicular centre lines line up with adjacent straight lines around the edges and through the middle of adjacent hypedra such that when the wave patterns are read through different parts of the matrix some trajectories will be read as flat lines as illustrated in FIG. 14(iv) marked 'f'. Wave patterns through the middle portion and across the corners on the other hand, will read as waveforms with maximum curvatures or increased amplitudes.

It will be noted that the wave lines appear to be perfect sinusoidal lines whereas in fact the lines differ very slightly from this following nearly exactly the same lines which are however more properly described as parabolic trajectories. Although the difference is miniscule it is considered that this tiny discrepancy may be the root cause of the perceived background radiation in space and the apparent expansion of the universe which famously requires that a mathematical constant be artificially hand applied to fix-up the mathematical discrepancies between a steady state definition of space (as initially proposed by Einstein) and the notion that the universe has been expanding for the past billions of years based on Hubble's optical observations.

In addition to the cosmological constant there are many more inexplicable hand-applied mathematical constants which may also have origins in the subtle misinterpretation of space based on electromagnetic data rooted in distortable space-time activities rather than free-space.

Electromagnetic (and other) wave structures are conventionally represented as basically two dimensional activities or structures (like ripples in a pond) with no real satisfactory indications or explanations as to what activities occur above and below the sinusoidal lines and in each of the three dimensions of space. Interference patterns are sometimes represented two dimensionally to demonstrate constructive and destructive interference patterns from two or more coherent sources however these diagrams and descriptions never really explain how waves propagate three dimensionally in space-time, and moreover there is no vision regarding why and what activity occurs between the wave fronts and what drives the waves in terms of parcels of energy which sheds light on a satisfactory wave-particle duality theory or model.

FIG. 15 in conjunction with all the other preceding figures and preceding text and descriptions therefore seeks to describe three dimensional wave activity and electromagnetism more explicitly and consistently so that it can be visualised and understood empirically or kinaesthetically (without resorting to highly abstract and invisible mathematics), and such that the information disclosed can be used by anyone skilled in the art as a 'blue-print' or better an electromagnetic 'road-map' with which to design new materials and electromagnetic structures for a multiplicity of useful purposes and especially to provide, harvest and conduct energy more efficiently.

The invention claimed is:

1. A method of modeling a pathway for an electromagnetic wave, the method including the steps of:
modelling a three dimensional lattice of close-packed hyperhedrons, each hyperhedron being rotated perpendicularly relative to its adjacent and contiguous hyperhedrons; including defining each of the hyperhedrons as a four sided volume externally bounded by four saddle shaped hyperbolic paraboloid curved surfaces defined by the eight shorter edges of four close-packed tetrahedral units; the four close-packed tetrahedral units sharing a common axis forming a main central axis of a first hyperhedron being a modular volume unit having six outer points, being equivalent to six spatial points of a specifically dimensioned octahedron, in which the distance between the outer points of the first hyperhedron on the main central axis is the same length as the distance between each pair of four outer adjacent points or corners in a perpendicular plane to the main central axis; four additional similar second hyperhedral units being close-packed and surrounding the first hyperhedral unit, the main axis of the first hyperhedron being perpendicular to each of the respective main axes of the four second hyperhedrons, defining one half of an oscillation of a wave form as being a line across said saddle shaped curved surface, defining a second half of one oscillation of the wave form by an extension of the line across the saddle shaped curved surfaces of adjacent hyper-parabolic interface curved surfaces of the adjacent hyperhedral units, and propagating the wave oscillation across the saddle shaped curved surfaces of the adjacent and contiguous hyperhedrons in three spatial dimensions, thereby describing a three dimensional pathway for an electromagnetic wave.

2. A method of modeling a pathway for an electro-magnetic wave as claimed in claim 1, further including defining the line across said saddle-shaped curved surface as being a parabolic line between diagonally opposite corners of said saddle-shaped curved surface, forming the one half of an oscillation of a wave form, and defining the extension of the line forming the second half of one oscillation of the wave form as being a line between diagonally opposite corners of the saddle shaped curved surface of the adjacent hyperhedral unit, thereby completing one oscillation of a wave form and the wave form therefore being a parabolic wave form.

3. A method of modeling a pathway for an electro-magnetic wave as claimed in claim 1, including the step of further defining the line across said saddle-shaped curved surface as being a straight line between a mid-point on one edge and a mid-point on an opposite edge of the saddle shaped curved surface.

4. A method of modeling a pathway for an electro-magnetic wave as claimed in claim 1 including the step of further defining the line across said saddle-shaped curved surface as being a straight line along an edge between two adjacent corners of the saddle-shaped curved surface.

5. A method of modeling a pathway for an electro-magnetic wave as claimed in claim 1, including the step of defining additional pathways of electro-magnetic waves, the additional pathways being lines propagating across the saddle shaped surfaces of hyperhedrons in the three dimensional lattice of close-packed hyperhedrons.

6. A method of modeling a pathway for an electro-magnetic wave as claimed in claim 1, further including the steps of:
defining a conductor as a series of hyperhedral units in which each hyperhedral unit is adjacent hyperhedral units on two opposing saddle shaped curved surfaces, the series forming a line-up of hyperhedral units, the other two saddle shaped curved surfaces defining a boundary or limit of flux strength when two or more conductors are close-packed, such that the pathway for an electro-magnetic wave is a flux pathway following a boundary of flux.

7. A method of modeling a pathway for an electro-magnetic wave as claimed in claim 6, further including the steps of:
modeling three said conductors stacked and crossing over each other, arranged about a spin axis such that the three conductors pass by each other in a mutually perpendicular configuration, said three conductors carrying current such that when viewed on a page as an isometric view with the spin axis perpendicular to the page, either:
for a right-handed spin direction of the three perpendicular conductors forming a right-handed node, when the current in all three conductors flows downwards, the flux interchange between the three conductors through which the spin axis passes, presents a magnetic south pole facing up out of the page, and when the current in all three conductors flows upwards, the flux interchange through which the spin axis passes between the three conductors presents a magnetic north pole facing up out of the page; or
for a left-handed spin direction of the three perpendicular conductors forming a left-handed node, when the current in all three conductors flows upwards, the flux interchange between the three conductors through which the spin axis passes, presents a magnetic south pole facing up out of the page, and when the current in all three conductors flows downwards, the flux interchange through which the spin axis passes between the three conductors presents a magnetic north pole facing up out of the page.

8. A method of modeling a pathway for an electro-magnetic wave as claimed in claim 7 further including the steps of:
stacking together a first and a second of said nodes, the first node having an opposite spin direction to the second node, such that the spin axis of the first node is aligned with the spin axis of the second node forming a common central axis,
defining the flow of current through the first spin node as being in the opposite direction to the flow of current in the second spin node such that the polarity of the nodes along the common central axis are attracting, the nodes therefore close packing in a minimum space with a minimum energy.

9. A method of modeling a pathway for an electro-magnetic wave as claimed in claim 8, further including the steps of:
stacking additional nodes such that the polarity of the nodes along the common central axis are attracting,
considering the conductors as wires, interconnecting conductors to maintain the current direction in each conductor to thereby internalize the flux field.

10. An elongate winding having improved efficiency obtained by utilizing a structure as modelled in claim 9.

11. A conductor means having improved efficiency obtained by utilizing a structure as modeled in claim 9.

12. A method of modeling a pathway for an electro-magnetic wave as claimed in claim 7 further including the steps of:
stacking together a first and a second of said nodes, the first node having an opposite spin direction to the second node, such that the spin axis of the first node is aligned with the spin axis of the second node,
defining the flow of current through the first spin node as being in the same direction as the flow of current in the second spin node such that the polarity of the nodes along the common central axis are repelling.

13. A method of modeling a pathway for an electro-magnetic wave as claimed in claim 7, further including the steps of:
considering the three conductors as electrically conductive and magnetically permeable pathways through a lattice of a material,
adding three additional conductors to the three conductors to form a stack, each of the three additional conductors being parallel to one of the three conductors, such that they are nested or close-packed at a minimum energy level,
defining the current direction of each conductor to create either a continuous north-south polarity or an alternating north-south-north-south-north polarity along an axis perpendicular to the page.

14. A material having specific electromagnetic functions obtained by utilizing a structure as modeled in claim 13.

15. A piezoelectric material produced using the method of claim 13.

16. A material having electromagnetic properties obtained by utilizing a structure as modeled in claim 13 wherein input of external force causes the first and second autonomous cube structures to move or accelerate relative to one another, thereby causing forces of tension and compression to develop therebetween and along diagonal means linking between the two associated two sets of cube structures, generating and internally propagating three dimensional electromagnetic wave structures within the arrangement such that wave structures further develop into variable and resonant frequencies within the first and second autonomous cube structures defining an electrical potential gradient between the two cube structures, such that input of said external force applied to one set of the two cube structures cause the repetitive extension and contraction of tension and compression means which act as conducting means across the electrical gradient, thereby initiating conduction of a flow of electrical energy through conductive line-ups of said hyperhedrons, such that electrical energy becomes usefully harvestable during the application of externally applied force.

17. A method of modeling a pathway for an electro-magnetic wave as claimed in claim 1, including modelling the three dimensional lattice as two interpenetrating primitive cubic arrays, forming a three dimensional substantially orthogonally based modular lattice comprising specifically dimensioned tetrahedral units grouped together in fours to describe hyperhedral units, each being defined by six outer points and having four hyperbolically curved outer surfaces, the modular lattice structure being extendable in all directions.

18. A method of modeling a pathway for an electro-magnetic wave as claimed in claim 1, including modelling the three dimensional lattice as first and second autonomous cube structures that are normally displaced in each of three axes by half the length of the main central axis of a hyperhedron.

19. A method of modeling a pathway for an electro-magnetic wave as claimed in claim 18, including modeling the first and second autonomous cube structures as the edges of cubes defined by compressible means between orthogonally spaced outer points of the main central axes of the lattice of close-packed hyperhedrons, the two autonomous cube structures being constrained and linked spatially by a series of tension means diagonally linking and spatially triangulating the points of the first and second cube structures.

20. A method of modeling a pathway for an electro-magnetic wave as claimed in claim 19 wherein the first and second autonomous cube structures represent the molecular arrangement of a piezoelectric material.

21. A piezoelectric material produced using the method of claim 20.

22. A method of modeling a pathway for an electro-magnetic wave as claimed in claim 18, including modelling the first and second autonomous cube structures as the edges of cubes defined by tension means between orthogonally spaced outer points of the main central axes of the lattice of close-packed hyperhedrons, the two autonomous cube structures being constrained and linked spatially by a series of compression means diagonally linking and spatially triangulating the points of the first and second cube structures.

23. A method of modeling a pathway for an electro-magnetic wave as claimed in claim 18 wherein the first and second autonomous cube structures represent the molecular arrangement of a piezoelectric material.

24. A piezoelectric material produced using the method of claim 23.

25. A tool including at least one hyperhedral unit to analyze a hyperhedrally defined structure of space, the tool being obtained using the method claimed in claim 1.

26. A tool as claimed in claim 25 wherein the at least one hyperhedral unit is a series of modular hyperhedral units including a first and a second hyperhedral unit, each hyperhedral unit further including magnetic parts embedded within such that polarity of said magnetic parts only permits or encourages some specific relative orientations when the first and second hyperhedrons are joined by mating one of said four saddle shaped hyperbolic paraboloid curved surfaces of the first hyperhedron to one of said four saddle shaped hyperbolic paraboloid curved surfaces of the second hyperhedron.

* * * * *